US012587766B2

(12) United States Patent
Lim

(10) Patent No.: US 12,587,766 B2
(45) Date of Patent: Mar. 24, 2026

(54) IMAGE PIXEL AND IMAGE SENSOR DEVICE INCLUDING THEREOF

(71) Applicant: SAMSUNG ELECTRONICS CO., LTD., Suwon-si (KR)

(72) Inventor: Jungwook Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 146 days.

(21) Appl. No.: 18/666,428

(22) Filed: May 16, 2024

(65) Prior Publication Data

US 2025/0024176 A1 Jan. 16, 2025

(30) Foreign Application Priority Data

Jul. 10, 2023 (KR) ........................ 10-2023-0089092

(51) Int. Cl.

| | |
|---|---|
| ***H04N 25/772*** | (2023.01) |
| ***H04N 25/57*** | (2023.01) |
| ***H04N 25/76*** | (2023.01) |
| ***H04N 25/77*** | (2023.01) |
| ***H04N 25/78*** | (2023.01) |
| ***H10K 39/32*** | (2023.01) |
| ***H10K 39/38*** | (2023.01) |

(52) U.S. Cl.

CPC ........... *H04N 25/772* (2023.01); *H10K 39/32* (2023.02); *H10K 39/38* (2023.02)

(58) Field of Classification Search

CPC ........ H04N 25/57; H04N 25/77; H04N 25/76; H04N 25/78; H10K 39/32; H10K 39/38; H10H 30/81

See application file for complete search history.

(56) References Cited

U.S. PATENT DOCUMENTS

| | | | | |
|---|---|---|---|---|
| 9,300,887 | B2 | 3/2016 | Lee et al. | |
| 9,426,399 | B2 * | 8/2016 | Yamaguchi | H10F 39/811 |
| 10,615,228 | B2 | 4/2020 | Im et al. | |
| 10,741,599 | B2 | 8/2020 | Yanagita et al. | |
| 10,868,988 | B2 | 12/2020 | Lee et al. | |
| 11,457,164 | B2 * | 9/2022 | Jung | H04N 25/766 |
| 11,496,700 | B1 | 11/2022 | Elizov et al. | |
| 2015/0187843 | A1 * | 7/2015 | Hatano | H10F 39/182 257/40 |
| 2017/0170239 | A1 * | 6/2017 | Lee | H10F 39/802 |
| 2018/0204882 | A1 * | 7/2018 | Segawa | H10K 19/20 |
| 2019/0131349 | A1 * | 5/2019 | Im | H10F 39/802 |

FOREIGN PATENT DOCUMENTS

| | | | |
|---|---|---|---|
| JP | 2015-076722 | A2 | 4/2015 |
| JP | 2021-019230 | A2 | 2/2021 |
| JP | 2022-073575 | A2 | 5/2022 |
| KR | 10-2022-0145783 | A | 10/2022 |

* cited by examiner

*Primary Examiner* — Marly S Camargo

(74) *Attorney, Agent, or Firm* — MORGAN, LEWIS & BOCKIUS LLP

(57) ABSTRACT

An image pixel includes an organic photodiode, a first electrode connected to a first voltage, and a second electrode connected to a second voltage. The first electrode and the second electrode are disposed on a first surface of the organic photodiode, and a read-out circuit is connected to the first electrode and the second electrode. The read-out circuit provides a first data voltage based on a first charge amount provided from the first electrode to a first data line, and provides a second data voltage based on a second charge amount provided from the second electrode to the first data line.

20 Claims, 21 Drawing Sheets

PX1_1

IMAGE PIXEL AND IMAGE SENSOR DEVICE INCLUDING THEREOF

CROSS-REFERENCE TO RELATED APPLICATION

This application claims priority under 35 U.S.C. § 119 to Korean Patent Application No. 10-2023-0089092, filed in the Korean Intellectual Property Office on Jul. 10, 2023, the disclosure of which is incorporated by reference herein in its entirety.

TECHNICAL FIELD

Embodiments of the present disclosure relate to a semiconductor image sensor device, and more particularly, to an image pixel including an organic photodiode, and an image sensor device including the image pixel.

DISCUSSION OF RELATED ART

A dynamic range may represent a signal ratio between a darkest region and a brightest region of an image generated by an image sensor device. An image sensor device may generate a high dynamic range (HDR) image in various ways, such as, for example, combining a plurality of images generated by varying an effective integration time (EIT) for a subject.

However, when an HDR image is generated based on a plurality of images with different effective integration times for the subject, the image generated based on a short effective integration time may not properly represent the image generated from a high-frequency light source. For example, an image generated based on a short effective integration time may not properly represent an optical signal generated from a light emitting diode (LED).

SUMMARY

Embodiments of the present disclosure provide an image pixel that generates data voltages for different illuminances based on a single effective integration time, and an image sensor device including the same.

An image pixel according to an embodiment of the present disclosure includes an organic photodiode, a first electrode connected to a first voltage, and a second electrode connected to a second voltage. The first electrode and the second electrode are disposed on a first surface of the organic photodiode. The image pixel further includes a read-out circuit connected to the first electrode and the second electrode, and configured to provide a first data voltage based on a first charge amount provided from the first electrode to a first data line, and to provide a second data voltage based on a second charge amount provided from the second electrode to the first data line.

An image pixel according to an embodiment of the present disclosure includes an organic photodiode, a first electrode disposed on a first surface of the organic photodiode, a first pump transistor connected between the first electrode and the first storage node and configured to operate in response to a first pump signal, a second pump transistor connected between the first electrode and the second storage node and configured to operate in response to a second pump signal, and a read-out circuit. The read-out circuit is configured to provide a first data voltage based on a first charge amount stored in the first storage node to a first data line, and to provide a second data voltage based on a second charge amount stored in the second storage node to the first data line.

An image sensor device according to an embodiment of the present disclosure includes a first image pixel including a first organic photodiode connected to a first electrode and a second electrode and configured to generate a first data voltage based on a charge amount integrated in the first electrode and to generate a second data voltage based on a charge amount integrated in the second electrode, a second image pixel including a second organic photodiode connected to a third electrode and a fourth electrode and configured to generate a third data voltage based on a charge amount integrated in the third electrode and to generate a fourth data voltage based on a charge amount integrated in the fourth electrode, and an analog-to-digital converter. The analog-to-digital converter is configured to generate a first data signal to a fourth data signal based on the first data voltage to the fourth data voltage, respectively. The image sensor device further includes an image merge circuit configured to generate a third image based on a first image and a second image. The first image is based on the first and third data signals, and the second image is based on the second and fourth data signals.

BRIEF DESCRIPTION OF THE DRAWINGS

The above and other features of the present disclosure will become more apparent by describing in detail embodiments thereof with reference to the accompanying drawings.

DETAILED DESCRIPTION

Figure 1:
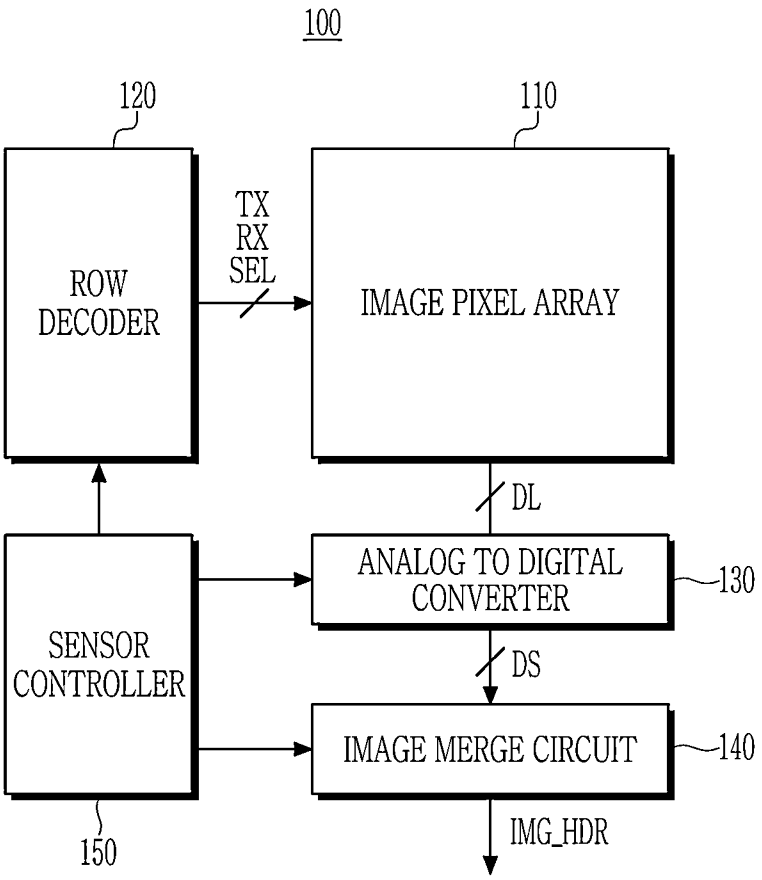
FIG. 1 is a block diagram of an image sensor device according to an embodiment of the present disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

Constituent elements described with reference to terms such as a driver or a block used in the detailed description may be implemented in the form of software, or hardware, or a combination thereof. For example, software may be a machine code, firmware, an embedded code, and application software. For example, hardware may include an electrical circuit, an electronic circuit, a processor, a computer, integrated circuit cores, a pressure sensor, an inertial sensor, a micro electro mechanical system (MEMS), a passive element, or a combination thereof.

FIG. 1 is a block diagram of an image sensor device according to an embodiment of the present disclosure.

Referring to FIG. 1, an image sensor device 100 may include an image pixel array 110, a row decoder 120, an analog-to-digital converter 130, an image merge circuit 140, and a sensor controller 150.

The image pixel array 110 may include a plurality of image pixels arranged in a row direction and a column direction. Each of the plurality of image pixels may generate a pixel output voltage under the control of the row decoder 120. For example, each of the plurality of image pixels may generate a reset voltage or a data voltage. Each of the plurality of image pixels may provide the generated pixel output voltage to a connected data line DL.

The row decoder 120 may be connected to the image pixel array 110 through a plurality of signal lines. The row decoder 120 may provide various types of control signals such as, for example, a transfer signal TX, a reset signal RX, and a select signal SEL to each of the plurality of pixels through the plurality of signal lines.

The analog-to-digital converter 130 may be connected to the image pixel array 110 through a plurality of data lines DL. The analog-to-digital converter 130 may convert a voltage (e.g., the pixel output voltage) provided through the data line DL to a digital signal. That is, the analog-to-digital converter 130 may sample a voltage level (e.g., an analog voltage) of the data line DL to convert the voltage to the digital signal. For example, the analog-to-digital converter 130 may perform sampling operations for the reset voltage and data voltage provided through the data line, respectively, and output a digital signal based on a difference between the sampled values.

In an embodiment, each of the image pixels may generate pixel output voltages corresponding to different illuminances in response to control signals provided from the row decoder 120. For example, each of the image pixels may sequentially output a first data voltage corresponding to a low luminance and a second data voltage corresponding to a high luminance. In this case, the analog-to-digital converter 130 may generate a digital signal DS corresponding to a low luminance based on the first data voltage, and may generate a digital signal DS corresponding to a high luminance based on the second data voltage.

In an embodiment, each of the image pixels may sequentially generate a first data voltage corresponding to a low luminance and a second data voltage corresponding to a high luminance, based on the amount of charges generated from one organic photodiode. In this case, since data voltages for both low and high illuminations may be generated based on one organic photodiode, a process for generating the image pixel array 110 can be improved or optimized. A specific implementation method of image pixels will be described in more detail with reference to the drawings below.

The image merge circuit 140 may receive a plurality of images from the analog-to-digital converter 130. For example, the image merge circuit 140 may receive a plurality of digital signals DS corresponding to a low luminance and a plurality of digital signals DS corresponding to a high luminance. In this case, the plurality of digital signals DS corresponding to low illuminance may implement a low illuminance image, and the plurality of digital signals DS corresponding to high illuminance may implement a high illuminance image.

The image merge circuit 140 may generate an HDR image IMG_HDR by merging a plurality of images. For example, the image merge circuit 140 may generate an HDR image IMG_HDR by merging a low-illuminance image and a high-illuminance image.

The sensor controller 150 may control overall operations of the image sensor device 100. For example, the sensor controller 150 may control operation timing of the image pixel array 110, the row decoder 120, the analog-to-digital converter 130, and the image merge circuit 140.

Referring to FIG. 1, an embodiment in which the image merge circuit 140 is included in the image sensor device 100 has been representatively described, but the scope of the present disclosure is not limited thereto. For example, the image merge circuit 140 may be included in an external image signal processor of the image sensor device 100.

Figure 2:
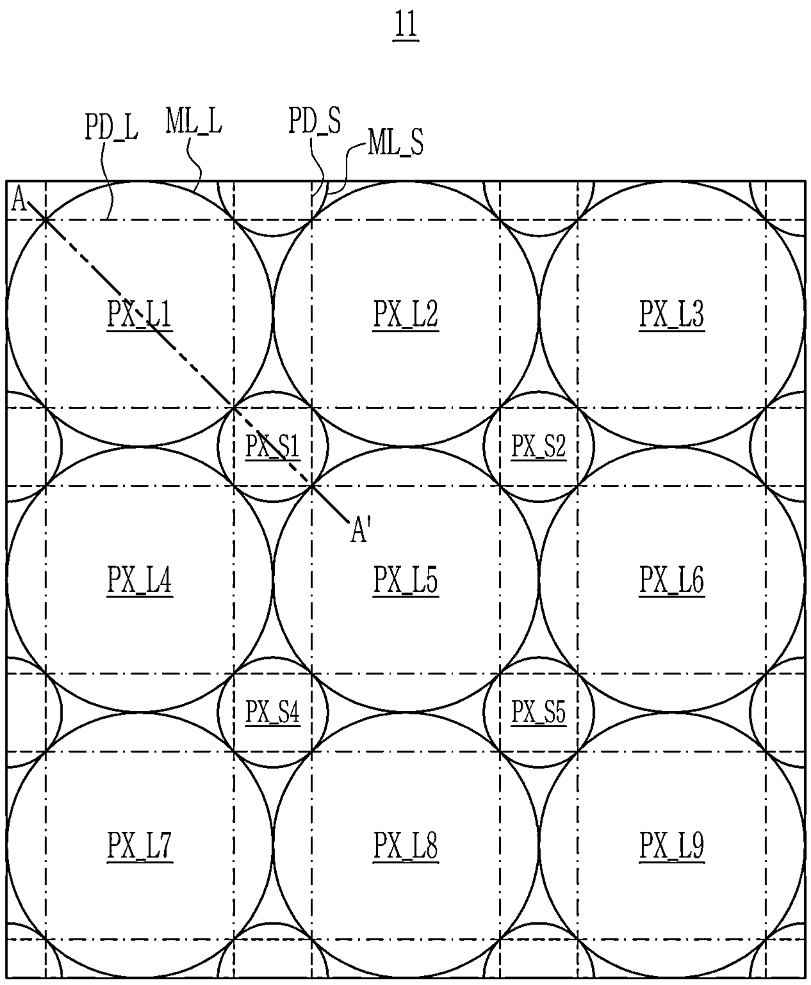
FIG. 2 is a top plan view illustrating a part of an image pixel array of FIG. 1, implemented according to an embodiment of the present disclosure.

FIG. 2 is a top plan view illustrating a part of the image pixel array of FIG. 1, implemented according to an embodiment of the present disclosure.

Referring to FIG. 1 and FIG. 2, the image pixel array 11 may include first to ninth large image pixels PX_L1 to PX_L9, first and second small image pixels PX_S1 and PX_S2, and fourth and fifth small image pixels PX_S4 and PX_S5. However, the scope of the present disclosure is not limited to the number of large image pixels and small image pixels included in image pixel array 11.

The first large image pixel PX_L1 to the ninth large image pixel PX_L9, the first small image pixel PX_S1 and the second small image pixel PX_S2, and the fourth small image pixel PX_S4 and the fifth small image pixel PX_S5 may respectively include different photodiodes. For example, the first large image pixel PX_L1 to the ninth large image pixel PX_L9 each may include a large photodiode PD_L. The first small image pixel PX_S1 and the second small image pixel PX_S2 and the fourth small image pixel PX_S4 and the fifth small image pixel PX_S5 each may include a small photodiode PD_S.

The first large image pixel PX_L1 to the ninth large image pixel PX_L9 each may form a pixel group together with an adjacent small image pixel. For example, the first large image pixel PX_L1 may form a first pixel group with the first small image pixel PX_S1, and the second large image pixel PX_L2 may form a second pixel group with the second small image pixel PX_S2. Similarly, the fourth large image pixel PX_L4 may form a fourth pixel group with the fourth small image pixel PX_S4, and the fifth large image pixel PX_L5 may form a fifth pixel group with the fifth small image pixel PX_S5.

One pixel group may generate pixel output voltages of different illuminances for a single subject. For example, a large image pixel may generate a pixel output voltage corresponding to a low illumination, and a small image pixel may generate a pixel output voltage corresponding to a high illumination.

A large micro-lens ML_L may be disposed on a large photodiode PD_L. A small micro-lens ML_S may be disposed on a small diode PD_S. The large micro-lens ML_L may be larger than the small micro-lens ML_S in size. In this case, the amount of light received in the large micro-lens ML_L may be greater than that of the small micro-lens ML_S. Therefore, a data voltage generated by a large image pixel may be saturated at a lower illuminance than a data voltage generated by a small image pixel.

In an embodiment, the size of the large micro-lens ML_L may be more than about 10 times of the size of the small micro-lens ML_S. Therefore, the small micro-lens ML_S may have a relatively small size. In this case, due to the relatively small size of the small micro-lens ML_S, dispersion may occur in the size and/or thickness of the small micro-lens ML_S, and accordingly, dispersion may also occur in the size of the data voltages generated by image pixel array 11.

Figure 3:
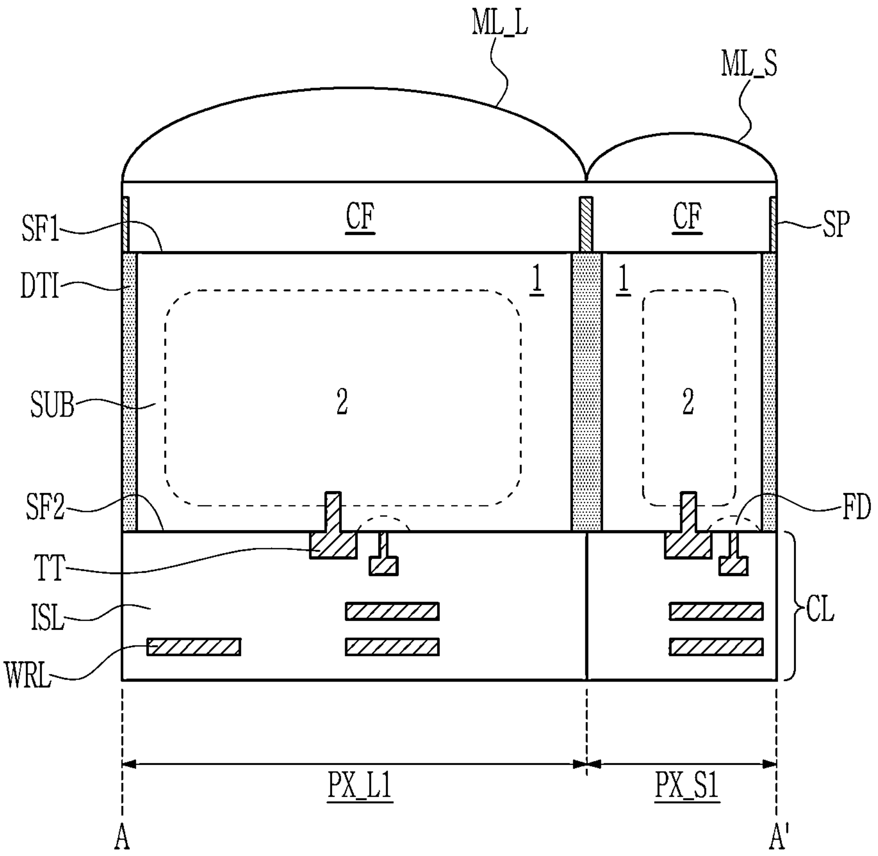
FIG. 3 is a cross-sectional view of the image pixel array of FIG. 2, taken along the line A-A', implemented according to an embodiment of the present disclosure.

FIG. 3 is a cross-sectional view of the image pixel array of FIG. 2, taken along the line A-A', according to an embodiment of the present disclosure.

Referring to FIGS. 1 to 3, the image pixel array 11 may include a substrate SUB including a first side SF1 and a second side SF2 facing each other.

A color filter CF may be disposed on the first side SF1 of the substrate SUB. The color filter CF may transmit specific wavelength (e.g., specific color) components of optical signals provided from the outside.

In an embodiment, a color filter CF of the first large image pixel PX_L1 and a color filter CF of the first small image pixel PX_S1 may transmit light signals of the same color. For example, image pixels included in a single pixel group may transmit light signals of the same color. However, the present disclosure is not limited thereto.

A separation membrane SP may be placed between color filters CF of different image pixels. The separation membrane SP may prevent light that has passed through a specific color filter from being provided to other color filters. For example, the separation membrane SP may prevent crosstalk between adjacent pixels.

In an embodiment, a fixed charge layer including, for example, various types of metal oxide and/or metal fluoride, may be further provided between the first side SF1 and the color filter CF. However, the present disclosure is not limited thereto.

A large micro-lens ML_L may be disposed on the color filter CF of the first large image pixel PX_L1. A small micro-lens ML_S may be disposed on the color filter CF of the first small image pixel PX_S1.

In an embodiment, the large micro-lens ML_L and the small micro-lens ML_S may be different from each other in thickness. For example, the thickness of the large micro-lens ML_L may be greater than the thickness of the small micro-lens ML_S. In this case, due to a thickness difference of the micro-lenses, the small micro-lens ML_S may not accurately recognize an optical signal provided from a direction of the large micro-lens ML_L. That is, due to the thickness difference of the micro-lenses, a blind area may be generated at an angle of receiving the optical signal by the small micro-lens ML_S. In this case, an error may occur in the data voltage generated by the first small image pixel PX_S1.

The substrate SUB may include a first doping area 1 doped with an impurity of a first conductivity type (e.g., P-type) and a second doping area 2 doped with an impurity of a second conductivity type (e.g., N-type). The first doping region 1 and the second doping region 2 may form a photodiode PD of each image pixel. For example, the first doping area 1 and the second doping area 2 included in the first large image pixel PX_L1 may form a large photodiode PD_L, and the first doping area 1 and the second doping area 2 included in the first small image pixel PX_S1 may form a small photodiode PD_S. Substrates SUB of different image pixels may be separated from each other by a deep trench isolation layer DTI.

In an embodiment, the large photodiode PD_L and the small photodiode PD_S may be generated through different processes. In this case, it may be difficult to generate both the large photodiode PD_L and small photodiode PD_S with an optimal process.

The large photodiode PD_L may generate a charge corresponding to the intensity of the optical signal provided through the large micro-lens ML_L. The small photodiode PD_S may generate a charge corresponding to the intensity of the optical signal provided through the small micro-lens ML_S.

The first large image pixel PX_L1 and the first small image pixel PX_S1 may each include a floating diffusion region FD, which may also be referred to as a floating diffusion node, and a transfer transistor TT. The floating diffusion region FD and the transfer transistor TT may be disposed on the second side SF2 of the substrate SUB.

The transfer transistor TT may provide the charge generated by the photodiode to the connected floating diffusion region FD, in response to the transfer signal provided from the row decoder 120. For example, the transfer transistor TT included in the first large image pixel PX_L1 may transfer the charge generated by the large photodiode PD_L to the floating diffusion region FD included in the first large image pixel PX_L1.

A circuit layer CL may be disposed on the second side SF2 of the substrate SUB. The circuit layer CL may include insulator ISL and a wiring lines WRL.

In an embodiment, a read-out circuit may be included in the circuit layer CL of each image pixel. For example, a read-out circuit included in the first large image pixel PX_L1 may generate a data voltage based on the charge stored in the floating diffusion region FD of the first large image pixel PX_L1, and may provide the generated data voltage to the data line DL through the wiring line WRL. The configuration and operation of the read-out circuit will be described in further detail below.

In an embodiment, the first doping region 1 and the second doping region 2 of the first small image pixel PX_S1 may be replaced with an organic photodiode. In an embodiment, the first doping region 1 and the second doping region 2 of the first large image pixel PX_L1 may be replaced with an organic photodiode. That is, one of the large photodiode PD_L and the small photodiode PD_S may be replaced with the organic photodiode. However, the present disclosure is not limited thereto.

Figure 4:
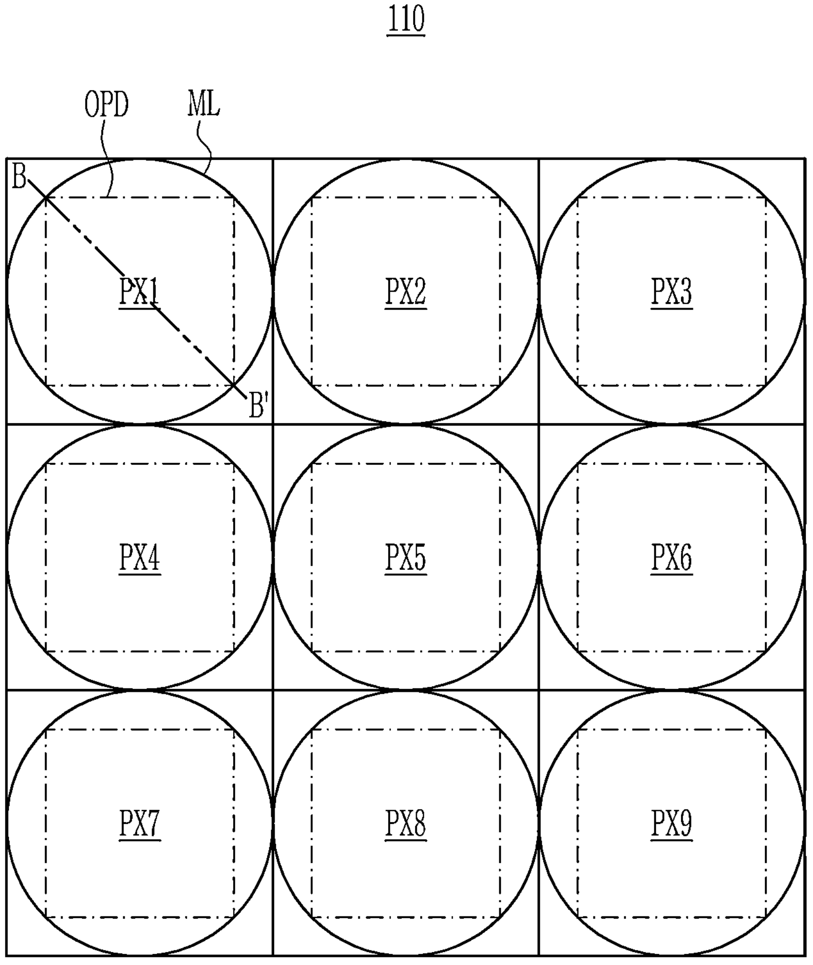
FIG. 4 is a top plan view of a part of an image pixel array of FIG. 1, implemented according to an embodiment of the present disclosure.

FIG. 4 is a top plan view of a part of the image pixel array of FIG. 1, implemented according to an embodiment of the present disclosure.

Referring to FIGS. 1 and 4, the image pixel array 110 may include a first image pixel PX1 to a ninth image pixel PX9. However, the scope of the present disclosure is not limited to the number of image pixels included in the image pixel array 110.

Each of the first image pixel PX1 to the ninth image pixel PX9 may include an organic photodiode OPD. The micro-lens ML may be disposed on each organic photodiode OPD.

In an embodiment, micro-lenses ML included in the first image pixel PX1 to the ninth image pixel PX9 may have the same size. In this case, since the micro-lens ML of the image pixel array 110 may be produced through the same process, the dispersion of the micro-lens ML in the process can be minimized or reduced. In addition, the micro-lens ML may be larger than the small micro-lens ML_S of FIG. 2 in size. In this case, the size and/or thickness distribution of the micro-lens ML caused by the fine process can be minimized or reduced. Therefore, according to an embodiment of the present disclosure, the error in the data voltage generated by the image pixel array 110 may be minimized or reduced.

In an embodiment, the organic photodiodes OPD included in the first image pixel PX1 to the ninth image pixel PX9 may all be generated through the same process. In this case, since the organic photodiodes OPD can be formed through a single process, process optimization may be performed efficiently.

For a more concise description, an embodiment in which each image pixel includes one organic photodiode OPD and one micro-lens ML will be representatively described hereinafter. However, the scope of the present disclosure is not limited to the arrangement method of the micro-lens ML included in the image pixel array 110. For example, one image pixel may include a plurality of micro-lenses. In this case, a plurality of micro-lenses ML may be disposed on each organic photodiode OPD. An embodiment in which a plurality of micro-lens ML is placed on one organic photodiode OPD will be described in more detail below with reference to FIGS. 16 and 20.

Each of the first image pixel PX1 to the ninth image pixel PX9 may generate a pixel output voltage of a different illuminance for a single subject. For example, each of the first image pixel PX1 to the ninth image pixel PX9 may generate both a pixel output voltage corresponding to low illumination and a pixel output voltage corresponding to high illumination. That is, according to an embodiment of the present disclosure, one image pixel may generate both a pixel output voltage corresponding to low illumination and a pixel output voltage corresponding to high illumination. Hereinafter, the configuration and operation of the first image pixel PX1 will be representatively described. However, the present disclosure is not limited thereto, and other image pixels of the image pixel array 110 may also be implemented similarly.

Figure 5:
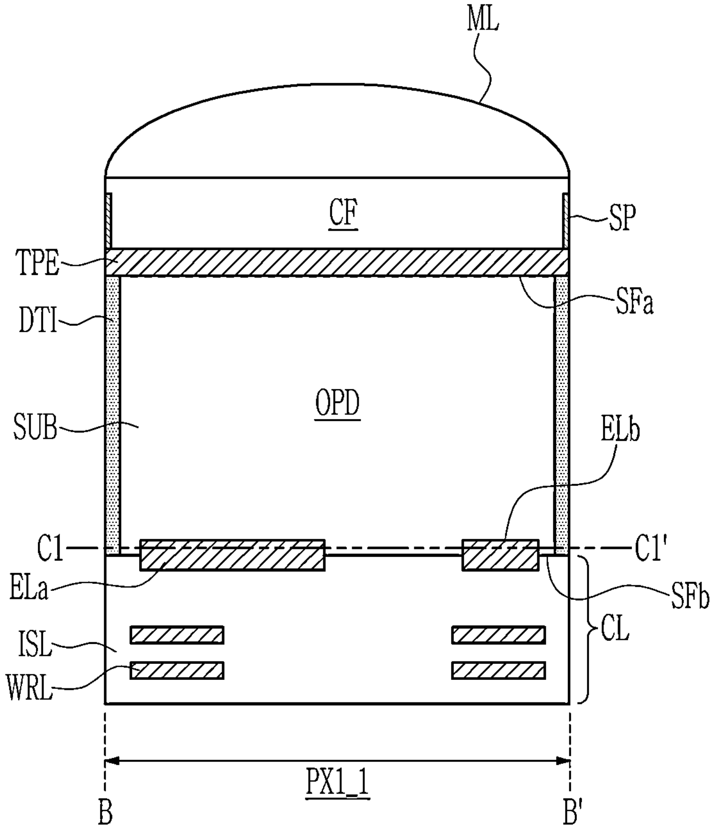
FIG. 5 is a cross-sectional view of the image pixel array of FIG. 4, taken along the line B-B', according to an embodiment of the present disclosure.

FIG. 5 is a cross-sectional view of the image pixel array of FIG. 4, taken along the line B-B', according to an embodiment of the present disclosure.

Hereinafter, referring to FIG. 5, the configuration of a first image pixel PX1_1 implemented according to an embodiment will be representatively described. However, the scope of the present disclosure is not limited thereto.

Referring to FIGS. 1 and 4 to 5, the first image pixel PX1_1 may include an organic photodiode OPD including a first surface SFa and a second surface SFb that face each other.

A transparent electrode TPE may be disposed on the first surface SFa of the organic photodiode OPD. A color filter CF, a micro-lens ML, and a separation membrane SP may be disposed on the transparent electrode TPE. The configuration and functions of the color filter CF, the micro-lens ML, and the separation membrane SP are similar to those previously described with reference to FIG. 3, and therefore, a further detailed description will be omitted.

The transparent electrode TPE may transmit an optical signal provided through the micro-lens ML. For example, the transparent electrode TPE may provide the optical signal provided through the micro-lens ML to the organic photodiode OPD.

In an embodiment, the transparent electrode TPE may be formed of, for example, ITO (Indium Tin Oxide), IZO (Indium zinc oxide), ZnO (Zinc oxide), SnO2 (Tin oxide), ATO (antimony-doped tin oxide), AZO (Al-doped zinc) oxide), gallium-doped zinc oxide (GZO), titanium dioxide (TiO2), or fluorine-doped tin oxide (FTO). However, the scope of the present disclosure is not limited thereto.

In an embodiment, the transparent electrode TPE may be connected to a ground voltage. However, the scope of the present disclosure is not limited thereto.

In an embodiment, the transparent electrode TPE may also be called an upper electrode.

A first electrode ELa and a second electrode ELb may be disposed on the second surface SFb of the organic photodiode OPD. The first electrode ELa may be connected to a first voltage, which is higher than the ground voltage, and the second electrode ELb may be connected to a second voltage, which is higher than the ground voltage. In this case, depending on a voltage difference provided to the transparent electrode TPE and the first electrode ELa, a charge corresponding to the intensity of the optical signal received by the micro-lens ML may be provided to the first electrode ELa. Similarly, depending on a voltage difference provided to the transparent electrode TPE and the second electrode ELb, a charge corresponding to the intensity of the optical signal received by the micro-lens ML may be provided to the second electrode ELb. For example, if the areas of the first electrode ELa and the second electrode ELb are the same and the first voltage is higher than the second voltage, the amount of charge provided to the first electrode ELa may be greater than the amount of charge provided to the second electrode ELb. However, the scope of the present disclosure is not limited thereto.

In an embodiment, the first electrode ELa and the second electrode ELb may also be referred to as lower electrodes.

In an embodiment, the first electrode ELa and the second electrode ELb may be metal electrodes. However, the scope of the present disclosure is not limited thereto.

In an embodiment, the first electrode ELa and the second electrode ELb may be opaque electrodes. However, the scope of the present disclosure is not limited thereto.

The amount of charges provided to the first electrode ELa may be determined based on the area of the first electrode ELa, and the amount of charges provided to the second electrode ELb may be determined based on the area of the second electrode ELb. For example, when levels of the voltages provided to first electrode ELa and second electrode ELb are the same and the area of first electrode ELa is larger than the area of second electrode ELb, the amount of charge provided to first electrode ELa may be greater than the amount of charge provided to second electrode ELb. However, the scope of the present disclosure is not limited thereto.

In an embodiment, a ratio of the amount of charge provided to the first electrode ELa and the second electrode ELb may be determined primarily based on the area of the first electrode ELa and the area of the second electrode ELb. For example, the ratio of charge amount provided to the first electrode ELa and the second electrode ELb may be coarsely determined by the ratio of area of the first electrode ELa and the area of the second electrode ELb in the production stage of image sensor device 100, and finely adjusted by the size of the first voltage and the size of the second voltage in the driving stage of the image sensor device 100. However, the scope of the present disclosure is not limited thereto.

Organic photodiode OPDs of different image pixels may be separated from each other by a deep trench isolation layer DTI. However, the scope of the present disclosure is not limited thereto.

A circuit layer CL may be disposed on the second surface SFb of the organic photodiode OPD. The circuit layer CL may include an insulator ISL and a wiring lines WRL.

In an embodiment, the circuit layer CL may include a read-out circuit. The read-out circuit generates data voltages based on the amount of charge provided from the first electrode ELa and the second electrode ELb, and may provide the generated data voltage to the data line DL through the wiring line WRL. For example, the read-out circuit may include a first floating diffusion node that stores the charge provided from the first electrode ELa, and a second floating diffusion node that stores the charge provided by the second electrode ELb. configuration and operation of the read-out circuit will be described in further detail with reference to FIG. 7.

Figure 6:
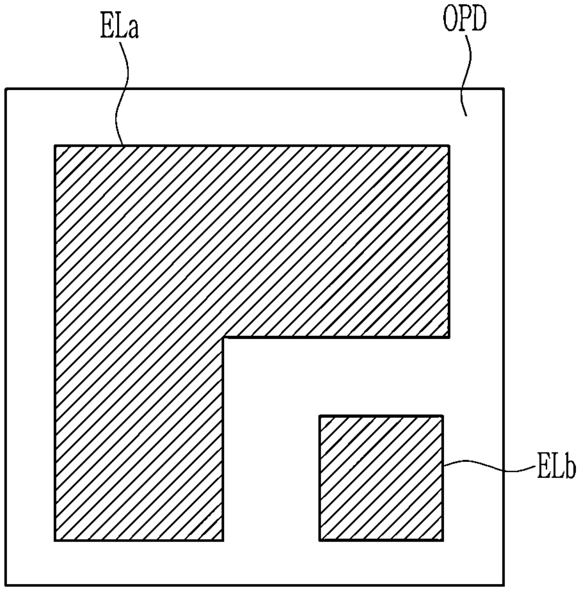
FIG. 6 is a top plan view of FIG. 5, taken along the line C1-C1', according to an embodiment of the present disclosure.

FIG. 6 is a top plan view of FIG. 5, taken along the line C1-C1', according to an embodiment of the present disclosure.

Referring to FIGS. 1 and 4 to 6, the area of the first electrode ELa may be larger than the area of the second electrode ELb. In this case, the amount of charge provided to the first electrode ELa in response to a single optical signal will be greater than the amount of charge provided to the second electrode ELb.

That is, according to an embodiment of the present disclosure, in response to an optical signal of the same intensity, the amount of charge provided to the first electrode ELa and the amount of charge provided to the second electrode ELb may be different from each other. In this case, the read-out circuit of the first image pixel PX1_1 may generate a data voltage for a low-illuminance environment based on the charge amount provided from the first electrode ELa, and generate a data voltage for a high-illuminance environment based on the charge amount provided from the second electrode ELb. A method of the first image pixel PX1_1 generating data voltages for different illuminance environments will be described hereinafter in detail with reference to FIG. 7.

Figure 7:
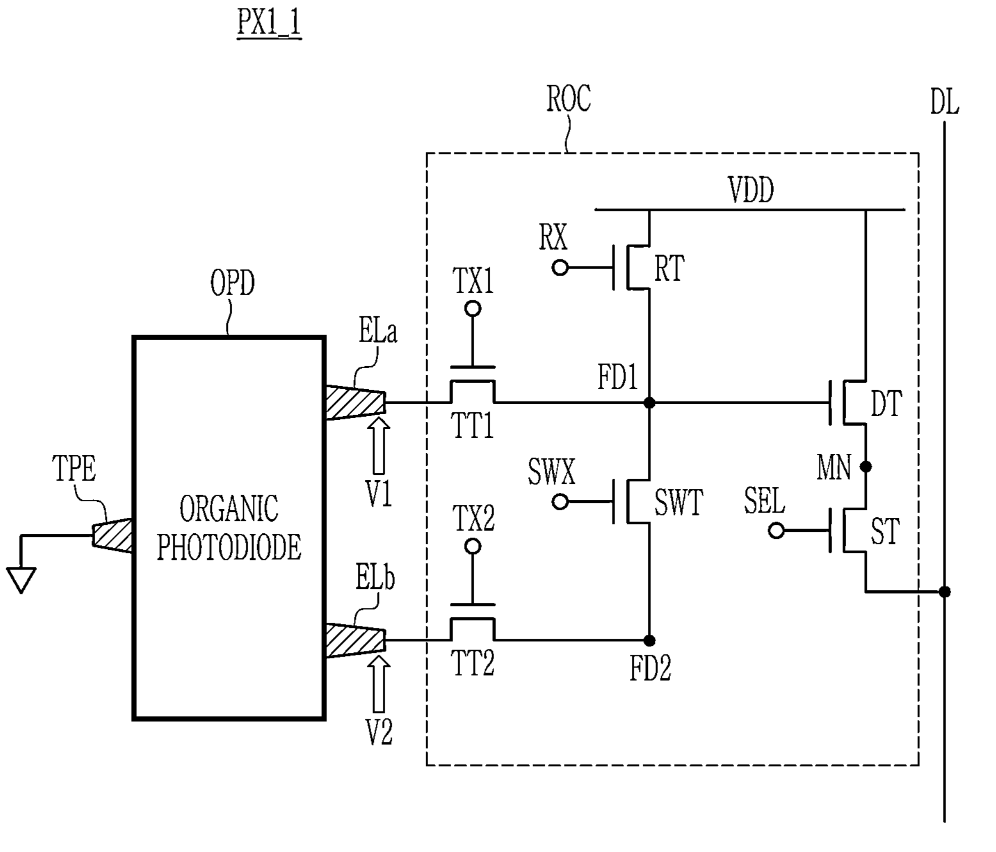
FIG. 7 shows a configuration of the image pixel of FIG. 5 in more detail according to an embodiment of the present disclosure.

FIG. 7 shows a configuration of the image pixel of FIG. 5 in more detail according to an embodiment of the present disclosure.

Referring to FIGS. 1 and 4 to 7, the first image pixel PX1_1 may include an organic photodiode OPD, a transparent electrode TPE, a first electrode ELa, a second electrode ELb, and a read-out circuit ROC. For convenience of explanation, a detailed description of the configuration of the previously described organic photodiode OPD, transparent electrode TPE, first electrode ELa, and second electrode ELb will be omitted.

The transparent electrode TPE may be connected to the ground voltage. The first electrode ELa may be connected to a first voltage V1. The second electrode ELb may be connected to a second voltage V2.

The read-out circuit ROC may be connected to the first electrode ELa, the second electrode ELb, and the data line DL. The read-out circuit ROC may include a first transfer transistor TT1, a second transfer transistor TT2, a reset transistor RT, a switch transistor SWT, a drive transistor DT, and a select transistor ST.

The first transfer transistor TT1 may be connected between the first electrode ELa and a first floating diffusion node FD1. The first transfer transistor TT1 may operate in response to the first transfer signal TX1 provided from the row decoder 120. For example, the first transfer transistor TT1 may be turned on in response to a logic-high first transfer signal TX1. In this case, charges accumulated in the first electrode ELa may move to the first floating diffusion node FD1.

The second transfer transistor TT2 may be connected between the second electrode ELb and a second floating diffusion node FD2. The second transfer transistor TT2 may operate in response to the second transfer signal TX2 provided from the row decoder 120. For example, the second transfer transistor TT2 may be turned on in response to a logic-high second transfer signal TX2. In this case, the charge accumulated in the second electrode ELb may move to the second floating diffusion node FD2.

The switch transistor SWT may be connected between the first floating diffusion node FD1 and the second floating diffusion node FD2. The switch transistor SWT may operate in response to a switch signal SWX provided from the row decoder 120. For example, the switch transistor SWT may be turned on in response to the switch signal SWX of logic high. In this case, the first floating diffusion node FD1 and the second floating diffusion node FD2 may be electrically connected.

In an embodiment, when the first floating diffusion node FD1 and the second floating diffusion node FD2 are electrically connected, the first floating diffusion node FD1 is not saturated even though the organic photodiode OPD receives an optical signal of high illuminance. In this case, the first image pixel PX1_1 may generate a data signal corresponding to higher illuminance.

The reset transistor RT may be connected between a power voltage VDD and the first floating diffusion node FD1. The reset transistor RT may operate in response to a reset signal RX provided from the row decoder 120. For example, the reset transistor RT may be turned on by a logic-high reset signal RX. In this case, the first floating diffusion node FD1 may be charged with a voltage, which is based on the power voltage VDD.

In an embodiment, during a time period when the reset signal RX is logic high, the switch signal SWX may be logic high. In this case, the second floating diffusion node FD2 may also be charged with a voltage, which is based on the power voltage VDD.

The drive transistor DT may be connected between the power voltage VDD and a middle node MN. The drive transistor DT may operate in response to a voltage of the first floating diffusion node FD1. For example, a gate terminal of the drive transistor DT may be connected to the first floating diffusion node FD1. In this case, the drive transistor DT may provide a voltage corresponding to the first floating diffusion node FD1 to the select transistor ST through the middle node MN. That is, the drive transistor DT may operate as a source follower of which an input terminal is connected to the first floating diffusion node FD1 and an output terminal is connected to the middle node MN.

In an embodiment, an operation for charging the first floating diffusion node FD1 and the second floating diffusion node FD2 with a voltage based on the power voltage VDD may be called a reset operation.

In an embodiment, an operation for reducing a voltage of the first floating diffusion node FD1 or second floating diffusion node FD2 based on the charges provided from the first electrode ELa or second electrode ELb may be called an integration operation.

In an embodiment, a voltage output by the drive transistor DT based on the voltage of the first floating diffusion node FD1 charged based on the power voltage VDD may be called a reset voltage.

In an embodiment, a voltage output by the drive transistor DT based on the voltage of the first floating diffusion node FD1 reduced through the integration operation may be called a data voltage.

The select transistor ST may be connected between the middle node MN and the data line DL. The select transistor ST may operate in response to the select signal SEL provided from the row decoder 120. For example, the select transistor ST may provide a voltage (e.g., a voltage corresponding to a voltage change amount of the first floating diffusion node FD1) from the drive transistor DT, which may be provided to the data line DL, in response to a logic-high select signal SEL.

In an embodiment, the first voltage V1 may be provided to the first electrode ELa through a wiring line which is different from a wiring line connecting the first electrode ELa and a source terminal of the first transfer transistor TT1.

In an embodiment, a wiring line providing the first voltage V1 to the first electrode ELa may be included in the circuit layer CL.

In an embodiment, a second voltage V2 may be provided to the second electrode ELb through a wiring line, which is different from a wiring line connecting the second electrode ELb and a source terminal of the second transfer transistor TT2.

In an embodiment, the wiring line providing the second voltage V2 to the second electrode ELb may be included in the circuit layer CL.

Figure 8:
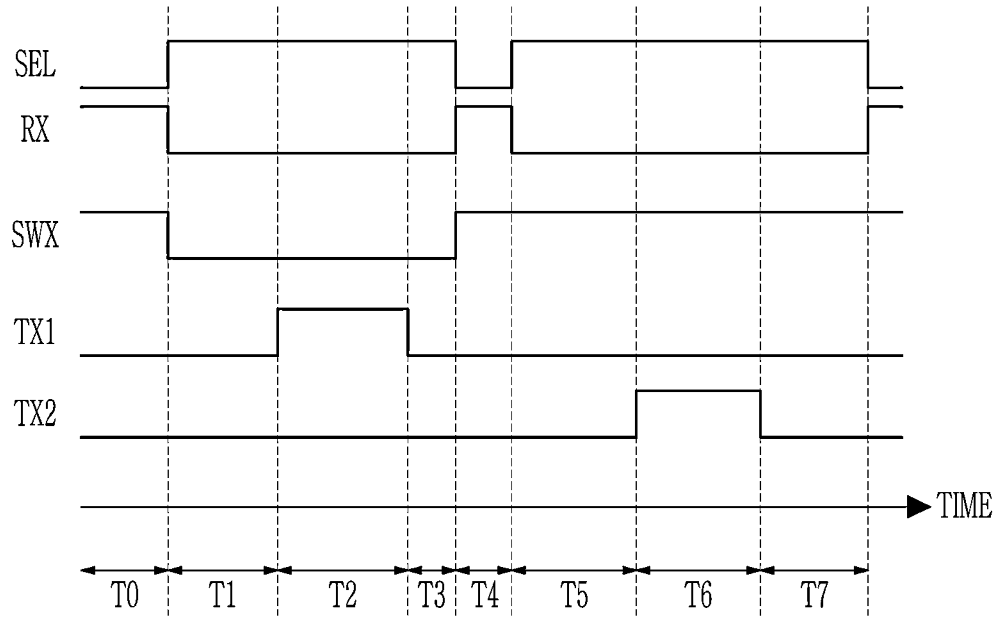
FIG. 8 is a timing diagram that shows the operation of the image pixel of FIG. 7 according to an embodiment of the present disclosure.

FIG. 8 is a timing diagram that shows the operation of the image pixel of FIG. 7 according to an embodiment of the present disclosure.

Referring to FIGS. 1 and 4 to 8, a first reset operation may be performed for the first image pixel PX1_1 in a 0th time period T0. For example, in the 0th time period T0, the reset signal RX and the switch signal SWX may be logic high. In this case, the reset transistor RT is turned on in response to the reset signal RX, and the first floating diffusion node FD1 and the second floating diffusion node FD2 may be charged with the power voltage VDD.

In a first time period T1, the reset signal RX may be logic low, the switch signal SWX may be logic low, and the select signal SEL may be logic high. In the first time period T1, the first image pixel PX1_1 responds to the select signal SEL, which is logic high, and may output the first reset voltage through the data line DL. In this case, the analog-to-digital converter 130 may receive the first reset voltage and perform a first reset sampling operation.

In a second time period T2, the first transfer signal TX1 may be logic high, and the switch signal SWX may be logic low. In this case, the first integration operation for the first image pixel PX1_1 may be performed. For example, during the second time period T2, the voltage of the first floating diffusion node FD1 may be reduced based on the amount of charge provided from the first electrode ELa.

In a third time period T3, the switch signal SWX may be logic low and the select signal SEL may be logic high. In this case, the first image pixel PX1_1 may output the first data voltage generated based on the voltage of the first floating diffusion node FD1 reduced through the first integration operation through the data line DL. The analog-to-digital converter 130 may perform a first data sampling operation by receiving the first data voltage.

In an embodiment, the analog-to-digital converter 130 may generate one digital signal based on a difference between the first reset voltage and the first data voltage. That is, the analog-to-digital converter 130 may generate a digital signal for one pixel included in a first luminance image based on the difference between the first reset voltage and the first data voltage.

In an embodiment, the first luminance image may be a low luminance image. In this case, the operation of the first image pixel PX1_1 during the 0th to third time periods T0 to T3 may be referred to as a low luminance sensing operation. However, the scope of present disclosure is not limited to such a term.

In the fourth time period T4, a second reset operation may be performed for the first image pixel PX1_1. For example, in the fourth time period T4, the reset signal RX and the switch signal SWX may be logic high. In this case, the reset transistor RT is turned on in response to the reset signal RX, and the first floating diffusion node FD1 and the second floating diffusion node FD2 may be charged with the power voltage VDD.

In a fifth time period T5, the reset signal RX may be logic low, the switch signal SWX may be logic high, and the select signal SEL may be logic high. In the fifth time period T5, the first image pixel PX1_1 may output a second reset voltage through the data line D1 in response to the logic-high select signal SEL. In this case, the analog-to-digital converter 130 may perform the second reset sampling operation by receiving the second reset voltage.

In a sixth time period T6, the second transfer signal TX2 may be logic high and the switch signal SWX may be logic high. In this case, a second integration operation for the first image pixel PX1_1 may be performed. For example, voltages of the first floating diffusion node FD1 and the second floating diffusion node FD2 may be reduced based on the amount of charges provided from the second electrode ELb.

In a seventh time period T7, the switch signal SWX and the select signal SEL may be logic high. In this case, the first image pixel PX1_1 may output a second data voltage generated based on the voltage of the first floating diffusion node FD1, reduced through the second integration operation, to the data line DL. In this case, the analog-to-digital converter 130 may perform a second data sampling operation by receiving the second data voltage.

In an embodiment, the analog-to-digital converter 130 may generate one data signal based on a difference between the second reset voltage and the second data voltage. That is, the analog-to-digital converter 130 may generate a digital signal for one pixel included in the second luminance image based on the difference between the second reset voltage and the second data voltage.

In an embodiment, the second luminance image may be a high luminance image. In this case, the operation of the first image pixel PX1_1 during the fourth to seventh time periods T4 to T7 may be called a high luminance sensing operation. However, the scope of the present disclosure is not limited thereto.

In an embodiment, the 0th to seventh time periods T0 to T7 may be included in one frame. That is, the 0th to seventh time periods T0 to T7 may correspond to one effective integration time.

Figure 9:
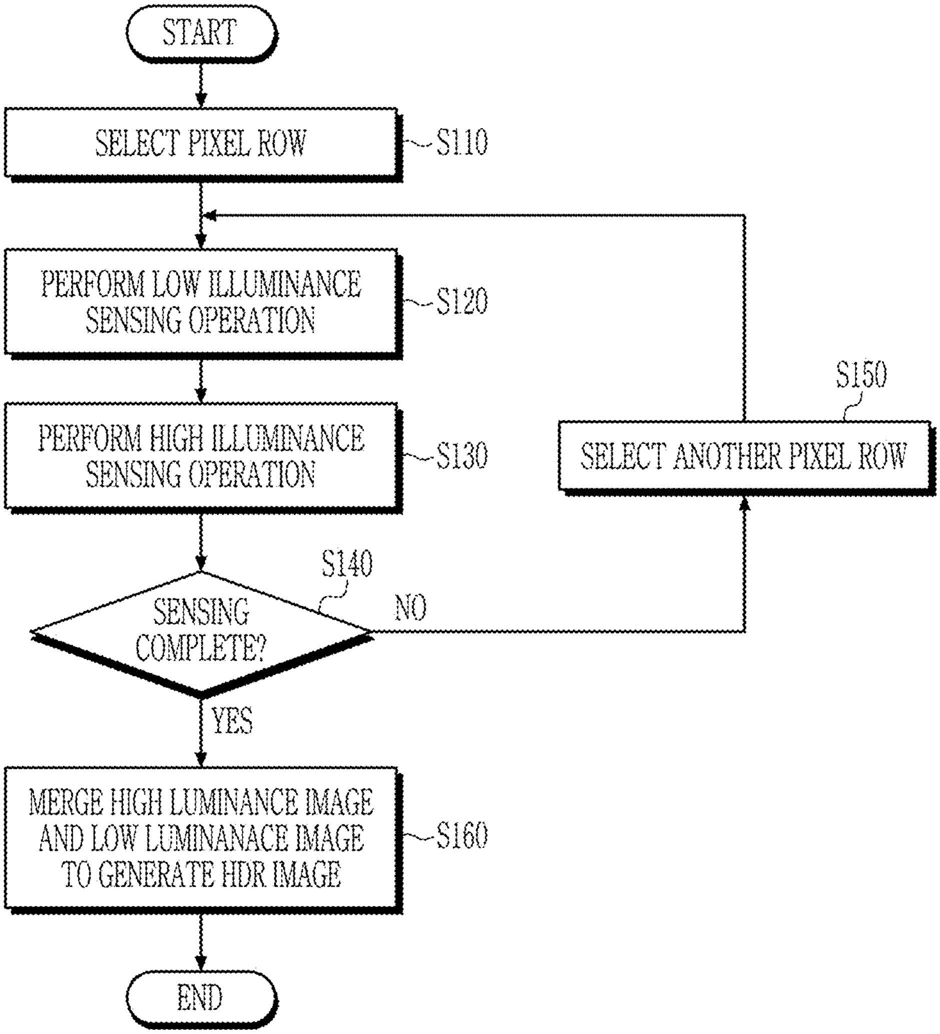
FIG. 9 is a flowchart that shows the operation of the image sensor device of FIG. 1 according to an embodiment of the present disclosure.

FIG. 9 is a flowchart that shows the operation of the image sensor device of FIG. 1 according to an embodiment of the present disclosure.

Hereinafter, referring to FIG. 9, the operation of the image sensor device 100 in a case in which the image pixels included in the image pixel array 110 are respectively implemented according to an embodiment of FIGS. 4 to 8 will be representatively described.

Referring to FIGS. 1 and 4 to 9, in operation S110, the image sensor device 100 may select one pixel row. For example, the image sensor device 100 may select one pixel row of the image pixel array 110, to which the transfer signal TX, the select signal SEL, the reset signal RX, and the like are to be provided. In this case, each of the image pixels included in the selected pixel row may share a control signal provided from the row decoder 120, and may be connected to different data lines DL.

In operation S120, the image sensor device 100 may perform a low luminance sensing operation for the selected pixel row. For example, each of the image pixels included in the selected pixel row may operate in a similar way to the 0th to third time periods T0 to T3 previously described with reference to FIG. 8. In this case, the analog-to-digital converter 130 may generate digital signals for one pixel row included in the low luminance image.

In operation S130, the image sensor device 100 may perform a high luminance sensing operation for the selected pixel row. For example, each of the image pixels included in the selected pixel row may operate in a similar way to the fourth to seventh time periods T4 to T7 previously described with reference to FIG. 8. In this case, the analog-to-digital converter 130 may generate digital signals for one row included in the high luminance image.

In an embodiment, the order of operations S120 and S130 may be changed. However, the scope of the present disclosure is not limited thereto.

In operation S140, the image sensor device 100 may determine whether sensing for all pixel rows is completed. For example, the image sensor device 100 may determine whether the low-luminance sensing operation and the high-luminance sensing operation have been completed for all image pixels included in the image pixel array 110.

If it is determined that the low-luminance sensing operation and the high-luminance sensing operation have not been completed for all image pixels, operation S150 may be performed.

If it is determined that the low-luminance sensing operation and the high-luminance sensing operation have been completed for all image pixels, operation S160 may be performed.

In operation S150, the image sensor device 100 may select another pixel row. Thereafter, the image sensor device 100 may repeatedly perform the above-described operations S120 and S140.

In operation S160, the image sensor device 100 may generate an HDR image IMG_HDR by merging the low luminance image and the high luminance image. For example, the image merge circuit 140 may generate an HDR image by merging a low-luminance image generated through the previously repeatedly performed operation S120 and a high luminance image generated through the previously repeatedly performed operation S130. there is.

Figure 10:
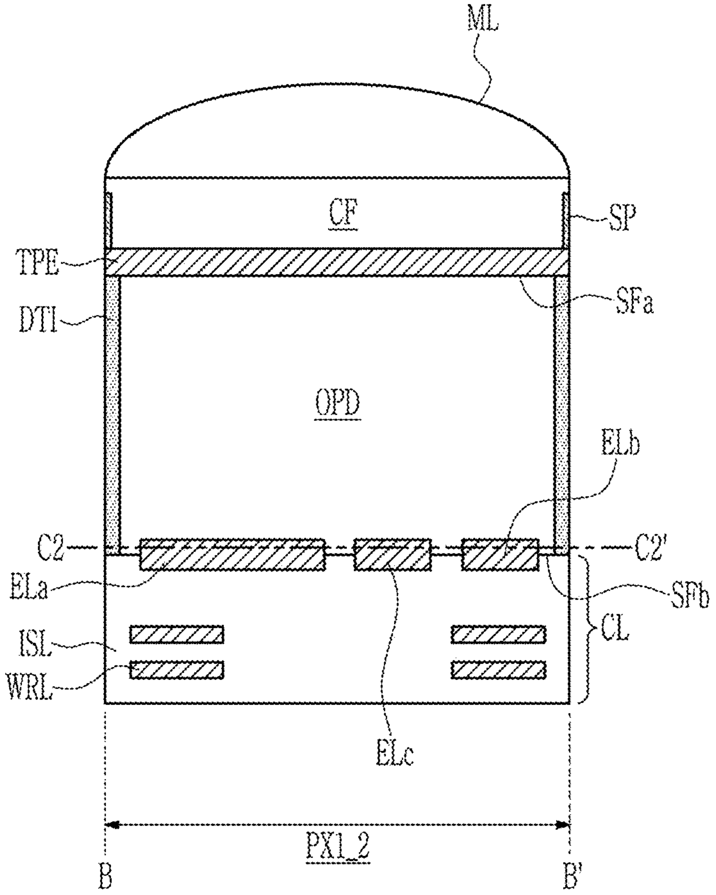
FIG. 10 is a cross-sectional view of the part of the image pixel array of FIG. 4, taken along the line B-B', according to an embodiment of the present disclosure.

FIG. 10 is a cross-sectional view of the part of the image pixel array of FIG. 4, taken along the line B-B', according to an embodiment of the present disclosure.

Hereinafter, referring to FIG. 10, the configuration of a first image pixel PX1_2 implemented according to an embodiment will be representatively described. However, the scope of the present disclosure is not limited thereto.

Referring to FIGS. 1 and 4 to 10, the first image pixel PX1_2 may include an organic photodiode OPD including a first surface SFa and a second surface SFb facing each other. A transparent electrode TPE may be disposed on the first surface SFa of the organic photodiode OPD. A color filter CF, a micro-lens ML, and a separation membrane SP may be disposed on the transparent electrode TPE. The configurations and functions of the transparent electrode TPE, the color filter CF, the micro-lens ML, and the separation membrane SP are similar to those described with reference to FIG. 5, and therefore a detailed description is omitted.

A first electrode ELa, a second electrode ELb, and a third electrode ELc may be disposed on the second surface SFb of the organic photodiode OPD. An area of the first electrode ELa may be larger than an area of the second electrode ELb.

A circuit layer CL may be disposed on the second surface SFb of the organic photodiode OPD. The circuit layer CL may include an insulator ISL and a wiring lines WRL. The circuit layer CL may include a read-out circuit. The read-out circuit generates data voltages based on the amount of charges provided from the first electrode ELa and the second electrode ELb, and may provide the generated data voltage to the data line DL through the wiring line WRL. A detailed configuration and operation of the read-out circuit are similar to those described with reference to FIGS. 7 and 8, and therefore a detailed description is omitted.

An electrode merge switch may be included in the circuit layer CL. The electrode merge switch may connect the third electrode ELc to one of the first electrode ELa and the second electrode ELb. For example, the electrode merge switch may operate in a first mode for connecting the third electrode ELc to the first electrode ELa, or in a second mode for connecting the third electrode ELc to the second electrode ELb. In this case, the amount of charges provided to a first transfer transistor TT1 of the read-out circuit ROC in the first mode may be determined according to the sum of the areas of the first electrode ELa and third electrode ELc. On the other hand, the amount of charges provided to a second transfer transistor TT2 of the read-out circuit ROC in the second mode may be determined according to the sum of the areas of the second electrode ELb and third electrode ELc. The configuration and operation of the electrode merge switch will be described in detail hereinafter with reference to FIG. 12.

Figure 11:
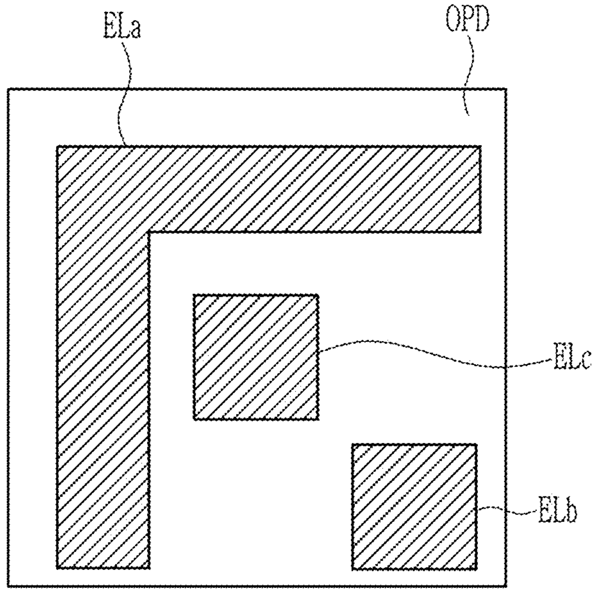
FIG. 11 is a top plan view of FIG. 10, taken along the line C2-C2', according to an embodiment of the present disclosure.

FIG. 11 is a top plan view of FIG. 10, taken along the line C2-C2', according to an embodiment of the present disclosure.

Referring to FIGS. 1, 4, and 10 to 11, the area of the first electrode ELa may be larger than the area of the second electrode ELb. The area of the third electrode ELc may be smaller than the area of the first electrode ELa. However, the scope of the present disclosure is not limited thereto.

Figure 12:
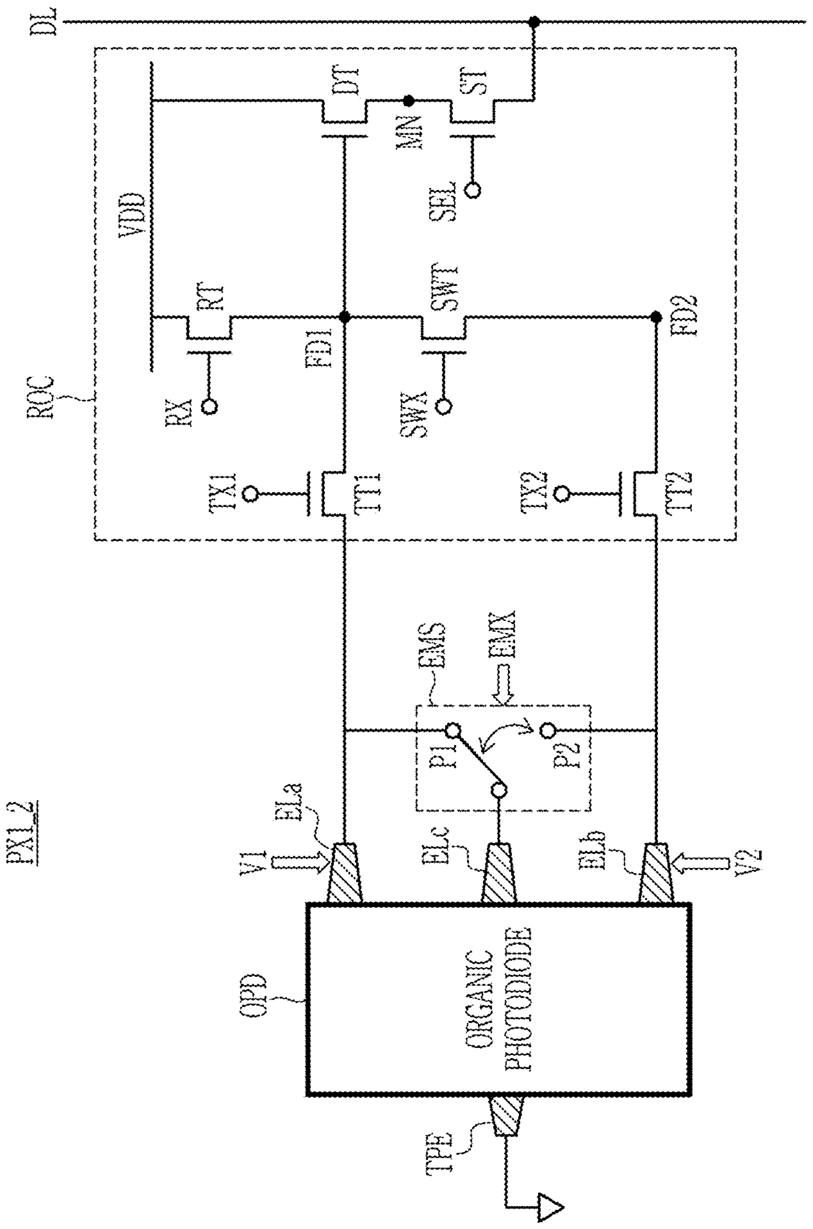
FIG. 12 shows the configuration of the image pixel of FIG. 10 in more detail according to an embodiment of the present disclosure.

FIG. 12 shows the configuration of the image pixel of FIG. 10 in more detail according to an embodiment of the present disclosure.

Referring to FIGS. 1, 4, and 10 to 11, the first image pixel PX1_2 may include the organic photodiode OPD, the transparent electrode TPE, the first electrode ELa, the second electrode ELb, the third electrode ELc, and the read-out circuit ROC. Detailed descriptions of the configuration and operation of the previously described organic photodiode OPD, transparent electrode TPE, first electrode ELa, and second electrode ELb, and read-out circuit ROC will be omitted.

The first image pixel PX1_2 may include an electrode merge switch EMS. The electrode merge switch EMS may be connected to the first electrode ELa, the second electrode ELb, and the third electrode ELc.

The electrode merge switch EMS may operate in response to an electrode merge signal EMX provided from the row decoder 120. For example, when the electrode merge signal EMX is logic high, the electrode merge switch EMS may connect the third electrode ELc and a first contact point P1. The first contact point P1 may be connected to the first electrode ELa and the first transfer transistor TT1. When the electrode merge signal EMX is logic low, the electrode merge switch EMS may connect the third electrode ELc and a second contact point P2. The second contact point P2 may be connected to the second electrode ELb and the second transfer transistor TT2.

When the electrode merge signal EMX is logic high, the amount of charges provided to the first floating diffusion node FD1 through the first transfer transistor TT1 from the organic photodiode OPD may be determined based on the area sum of the first electrode ELa and the third electrode ELc, and the amount of charges provided to the second floating diffusion node FD2 through the second transfer transistor TT2 from the organic photodiode OPD may be determined based on the area of the second electrode ELb. In this case, the ratio of the amount of charge provided to the first floating diffusion node FD1 through the first transfer transistor TT1 and the amount of charge provided to the second floating diffusion node FD2 through the second transfer transistor TT2 may be determined based on the ratio of the sum of the areas of the first electrode ELa and the third electrode ELc and the area of the second electrode ELb.

When the electrode merge signal EMX is logic low, the amount of charges provided to the first floating diffusion node FD1 from the organic photodiode OPD through the first transfer transistor TT1 may be based on the area of the first electrode ELa, and the amount of charges provided to the second floating diffusion node FD2 from the organic photodiode OPD through the second transfer transistor TT2 may be determined based on the sum of the area of the second electrode ELb and the area of the third electrode ELc. In this case, the ratio of the amount of charges provided to the first floating diffusion node FD1 through the first transfer transistor TT1 and the amount of charges provided to the second floating diffusion node FD2 through the second transfer transistor TT2 may be determined based on the ratio of the area of the first electrode ELa and the sum of the area of the second electrode ELb and the area of the third electrode ELc.

That is, according to an embodiment of FIGS. 10 to 12, since the ratio of the charge amount provided to the first floating diffusion node FD1 and the second floating diffusion node FD2 may be adjusted in the same illuminance environment, images with various dynamic ranges can be created.

Figure 13:
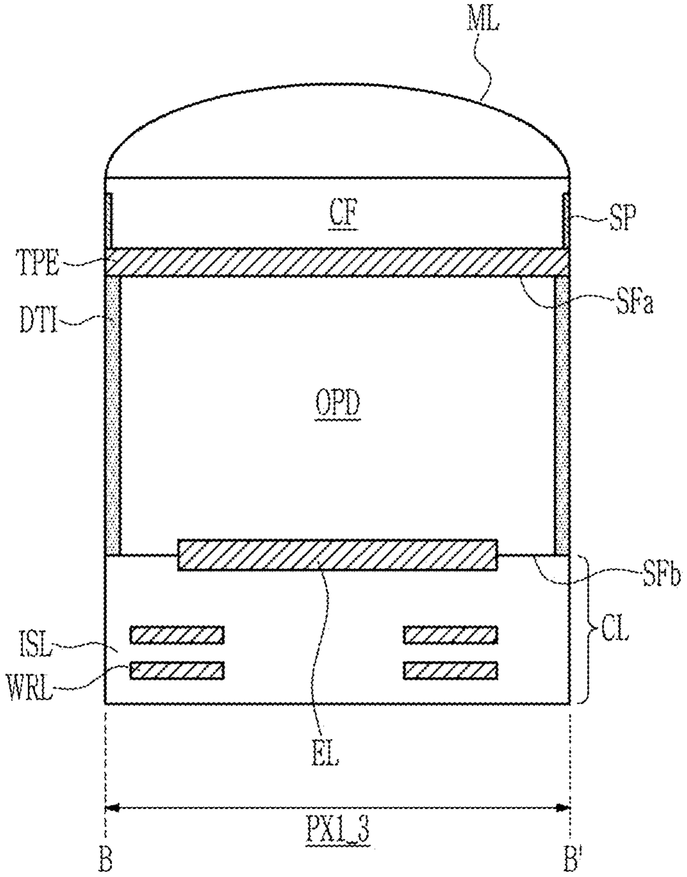
FIG. 13 is a cross-sectional view of the part of the image pixel array of FIG. 4, taken along the line B-B', according to an embodiment of the present disclosure.

FIG. 13 is a cross-sectional view of the part of the image pixel array of FIG. 4, taken along the line B-B', according to an embodiment of the present disclosure.

Hereinafter, a configuration of a first image pixel PX1_3 implemented according to an embodiment will be representatively described with reference to FIG. 13. However, the scope of the present disclosure is not limited thereto.

Referring to FIGS. 1, 4, and 13, the first image pixel PX1_3 may include an organic photodiode OPD including a first surface SFa and a second surface SFb facing each other. A transparent electrode TPE may be disposed on the first surface SFa of the organic photodiode OPD. The color filter CF, the micro-lens ML, and the separation membrane SP may be disposed on the transparent electrode TPE. The configurations and functions of the transparent electrode TPE, the color filter CF, the micro-lens ML, and the separation membrane SP are similar to those described with reference to FIG. 5, and therefore a detailed description is omitted.

One lower electrode EL may be disposed on the second surface SFb of the organic photodiode OPD. A circuit layer CL may be disposed on the second surface SFb of the organic photodiode OPD. The circuit layer CL may include a read-out circuit. In this case, the read-out circuit may generate a plurality of data voltages for different illuminance levels based on charges provided from one lower electrode EL. A detailed configuration and operation of the read-out circuit will be described hereinafter with reference to FIGS. 14 and 15.

In an embodiment, the lower electrode EL may be a metal electrode. However, the scope of the present disclosure is not limited thereto.

In an embodiment, the lower electrode EL may be an opaque electrode. However, the scope of the present disclosure is not limited thereto.

Figure 14:
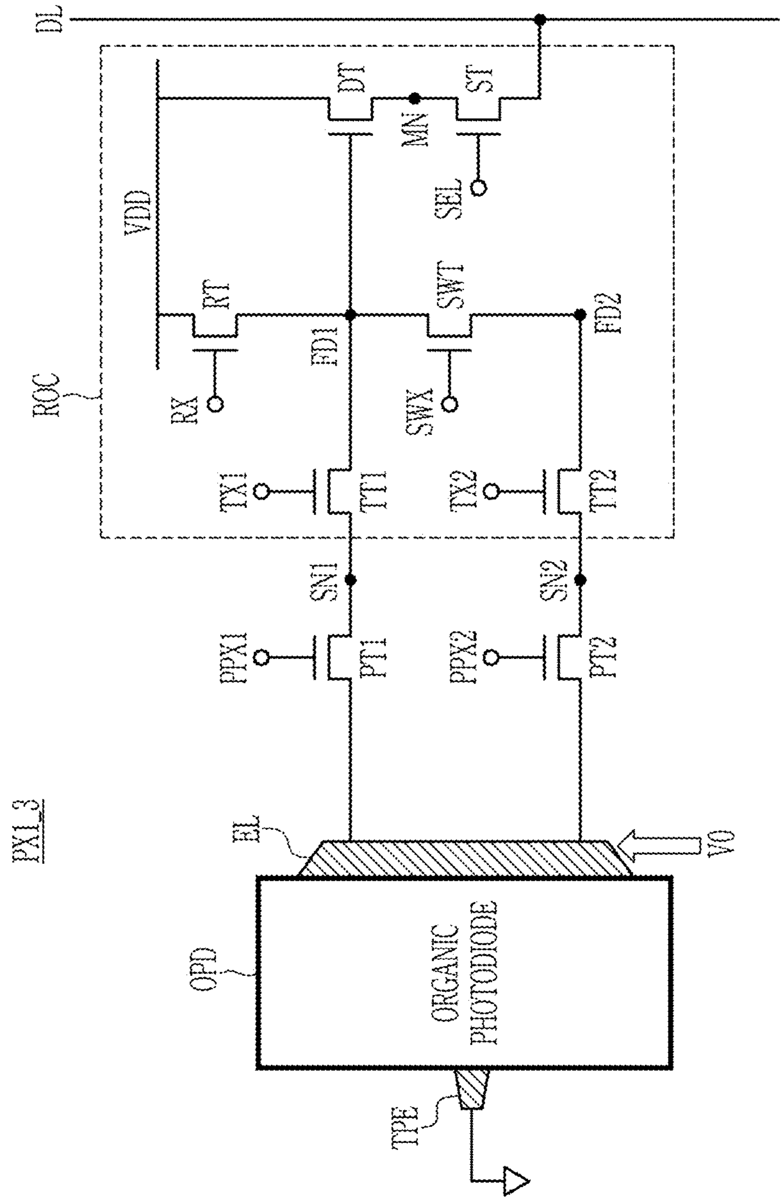
FIG. 14 shows the configuration of the part of the image pixel array of FIG. 13 in detail according to an embodiment of the present disclosure.

FIG. 14 shows the configuration of the part of the image pixel array of FIG. 13 in detail according to an embodiment of the present disclosure.

Referring to FIGS. 1, 4, 13 and 14, the first image pixel PX1_3 may include the organic photodiode OPD, the transparent electrode TPE, the lower electrode EL, and the read-out circuit ROC. Detailed descriptions of the configuration and operation of the previously described organic photodiode OPD, the transparent electrode TPE, and the read-out circuit ROC will be omitted.

In an embodiment, a 0th voltage V0 may be provided to the lower electrode EL. In this case, based on a difference between a voltage provided to the transparent electrode TPE and the 0th voltage, charges corresponding to the intensity of an optical signal received by the micro-lens ML may be provided to the lower electrode EL.

The first image pixel PX1_3 may include a first pump transistor PT1. The first pump transistor PT1 may be connected between the lower electrode EL and a first storage node SN1. The first pump transistor PT1 may operate in response to a first pump signal PPX1 provided from the row decoder 120. For example, the first pump transistor PT1 may be turned on in response to the first pump signal PPX1, which is logic high. In this case, the charge provided from the lower electrode EL may move to the first storage node SN1.

The first image pixel PX1_3 may include a second pump transistor PT2. The second pump transistor PT2 may be connected between the lower electrode EL and the second storage node SN2. The second pump transistor PT2 may operate in response to a second pump signal PPX2 provided from the row decoder 120. For example, the second pump transistor PT2 may be turned on in response to the second pump signal PPX2, which is logic high. In this case, the charge provided from the lower electrode EL may move to the second storage node SN2.

In an embodiment, the second pump signal PPX2 may repeat logic high and logic low transitions in very short periods. For example, the logic level of the second pump signal PPX2 may be toggled in high frequency. In this case, regardless of whether the optical signal provided from the outside is a flickering signal, the charge generated from the organic photodiode OPD may be stored in the second storage node SN2. For a more detailed example, although the organic photodiode OPD generates electrons based on the optical signal generated from a light source (e.g., signal, etc.) operating based on an LED, the second storage node SN2 may be provided with the amount of charges corresponding to an average illuminance of the flickering optical signal.

In an embodiment, a length of time that the second pump signal PPX2 is logic high may be very short. For example, while the second pump signal PPX2 is toggling, the sum of the lengths of the logic high time intervals of the second pump signal PPX2 may be shorter than the sum of the lengths of the logic high time intervals of the second pump signal PPX2. For example, the length of the logic high time of the second pump signal PPX2 may be short enough that the second storage node SN2 is not saturated during the logic high time of the second pump signal PPX2 even through the charge generated from the organic photodiode OPD is generated in the lower electrode EL based on an optical signal of very high intensity.

The first transfer transistor TT1 may be connected between the first storage node SN1 and the first floating diffusion node FD1. The first transfer transistor TT1 may operate in response to the first transfer signal TX1 provided from the row decoder 120. For example, the first transfer transistor TT1 may be turned on by the first transfer signal TX1, which is logic high. In this case, the charge stored in the first storage node SN1 may move to the first floating diffusion node FD1.

The second transfer transistor TT2 may be connected between the second storage node SN2 and the second floating diffusion node FD2. The second transfer transistor TT2 may operate in response to the second transfer signal TX2 provided from the row decoder 120. For example, the second transfer transistor TT2 may be turned on by the second transfer signal TX2, which is logic high. In this case, the charge stored in the second storage node SN2 may move to the second floating diffusion node FD2.

The operations of the reset transistor RT, the switch transistor SWT, the drive transistor DT, and the select transistor ST are similar to those described reference to FIG. 8, and therefore detailed descriptions will be omitted.

In an embodiment, the 0th voltage V0 may be provided to the lower electrode EL through a wiring line that is different from wiring lines connecting the lower electrode EL with source electrodes of the first and second pump transistors PT1 and PT2.

In an embodiment, the wiring line through which the lower electrode EL is provided with the 0th voltage V0 may be included in the circuit layer CL.

Figure 15:
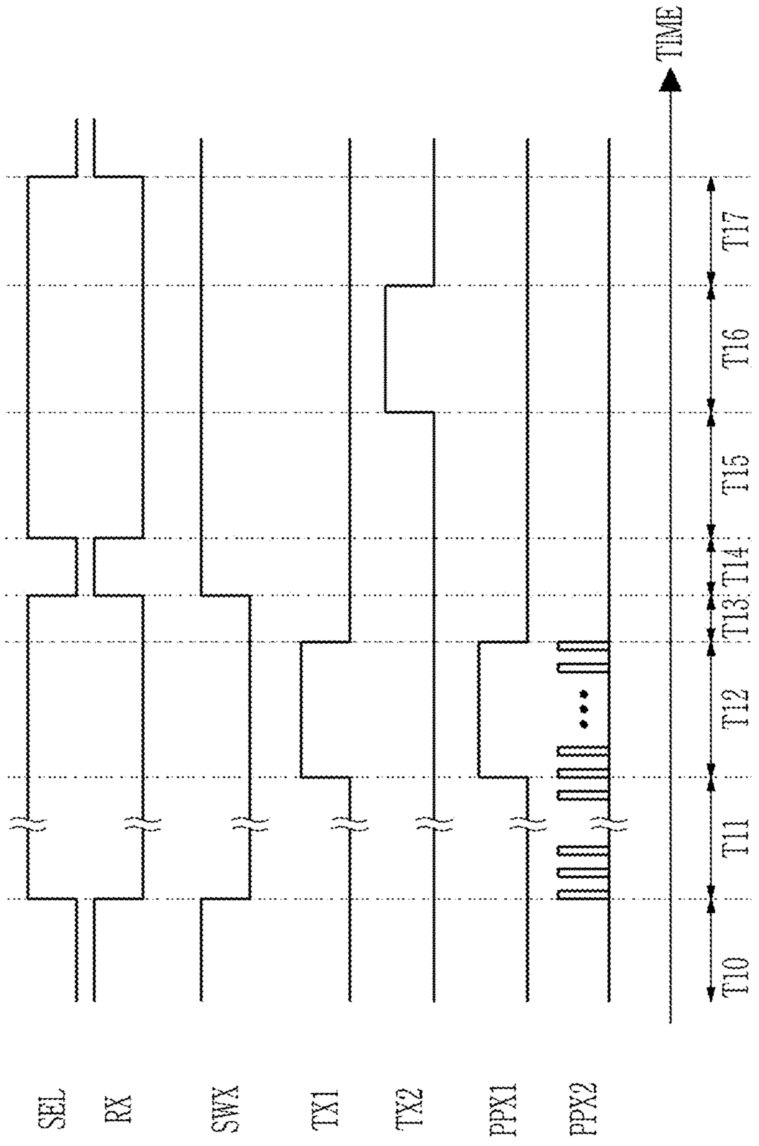
FIG. 15 is a timing diagram that shows the operation of the part of the image pixel array of FIG. 14 according to an embodiment of the present disclosure.

FIG. 15 is a timing diagram that shows the operation of the part of the image pixel array of FIG. 14 according to an embodiment of the present disclosure.

Referring to FIGS. 1, 4, and 13 to 15, a first reset operation for the first image pixel PX1_3 may be performed during a tenth time period T10. For example, in the tenth time period T10, the reset signal RX and the switch signal SWX may be logic high. In this case, the reset transistor RT is turned on in response to the reset signal RX, and the first floating diffusion node FD1 and the second floating diffusion node FD2 may be charged with the power voltage VDD.

In an eleventh time period T11, the reset signal RX may be logic low, the switch signal SWX may be logic low, and the select signal SEL may be logic high. In the eleventh time period T11, the first image pixel PX1_3 may output a first reset voltage through the data line DL in response to the select signal SEL, which is logic high. In this case, the analog-to-digital converter 130 may perform a first reset sampling operation by receiving the first reset voltage.

In an embodiment, during the eleventh time period T11, the first pump signal PPX1 may have a voltage level lower than the logic low. For example, during the eleventh time period T11, the first pump signal PPX1 may have a voltage level (e.g., negative voltage level) lower than the ground voltage. In this case, overflow from the lower electrode EL to the first storage node SN1 can be prevented during the effective integration time. However, the scope of the present disclosure is not limited thereto.

In a twelfth time period T12, the first pump signal PPX1 may be logic high, the first transfer signal TX1 may be logic high, and the switch signal SWX may be logic low. In this case, a first integration operation for the first image pixel PX1_3 may be performed. For example, in response to the first pump signal PPX1, which is logic high, the charge of the lower electrode EL may be stored in the first storage node SN1, and in response to the first transfer signal TX1, which is logic high, the charge stored in the first storage node SN1 may be provided to the first floating diffusion node FD1.

In a thirteenth time period T13, the switch signal SWX may be logic low and the select signal SEL may be logic high. In this case, the first image pixel PX1_3 may output a first data voltage generated based on a voltage of the first floating diffusion node FD1, reduced through the first integration operation, through the data line DL. The analog-to-digital converter 130 may perform a first data sampling operation by receiving the first data voltage.

During the eleventh time period to the twelfth time period T11 to T12, the second pump signal PPX2 may repeat logic high and logic low transitions. That is, the second pump signal PPX2 may be toggled during the eleventh time period to the twelfth time period T11 to T12. In this case, charges may be transferred gradually from the lower electrode EL to the second storage node SN2 through the second pump transistor PT2.

In an embodiment, the sum of the lengths of the time periods in which the second pump signal PPX2 is logic high during the eleventh time period to the twelfth time period T11 to T12 may be shorter than the length of the twelfth time period T12. For example, the sum of the lengths of the time period in which the second pump signal PPX2 is logic high may be shorter than the sum of the lengths of the time periods in which the first pump signal PPX1 is logic high.

In an embodiment, the sum of the lengths of the time periods in which the second pump signal PPX2 is logic high during the eleventh time period T11 to the twelfth time period T12 may be shorter than the sum of the lengths of the time periods in which the second pump signal PPX2 is logic low.

In an embodiment, the frequency at which the second pump signal PPX2 toggles during the eleventh time period T11 to the twelfth time period T12 may be greater than about 100 Hz. In this case, the charge corresponding to the average illuminance of the optical signal (e.g., a signal light, etc.) flickering through the second pump signal PPX2 may be stored in the second storage node SN2.

In an embodiment, the analog-to-digital converter 130 may generate one digital signal based on the difference between the first reset voltage and the first data voltage. That is, the analog-to-digital converter 130 may generate a digital signal for one pixel included in the first luminance image based on the difference between the first reset voltage and the first data voltage.

In an embodiment, the first luminance image may be a low luminance image. In this case, the operation of the first image pixel PX1_3 during the tenth to thirteenth time periods T10 to T13 may be referred to as a low luminance sensing operation. However, the scope of the present disclosure is not limited thereto.

In a fourteenth time period T14, a second reset operation for the first image pixel PX1_3 may be performed. For example, in the fourteenth time period T14, the reset signal RX and the switch signal SWX may be logic high. In this case, the reset transistor RT is turned on in response to the reset signal RX, and the first floating diffusion node FD1 and the second floating diffusion node FD2 may be charged with the power voltage VDD.

In a fifteenth time period T15, the reset signal RX may be logic low, switch signal SWX may be logic high, and the select signal SEL may be logic high. In the fifteenth time period T15, the first image pixel PX1_3 may output a second reset voltage through the data line DL in response to the select signal SEL, which is logic high. In this case, the analog-to-digital converter 130 may perform a second reset sampling operation by receiving the second reset voltage.

In a sixteenth time period T16, the second transfer signal TX2 may be logic high and the switch signal SWX may be logic high. In this case, a second integration operation for the first image pixel PX1_3 may be performed. For example, the voltages of the first floating diffusion node FD1 and the second floating diffusion node FD2 may be reduced based on the amount of charges provided from the second storage node SN2.

In a seventeenth time period T17, the switch signal SW and the select signal SEL may be logic high. In this case, the first image pixel PX1_3 may output the second data voltage generated based on the floating diffusion node FD1, reduced through the second integration operation, through the data line DL. In this case, the analog-to-digital converter 130 may perform a second data sampling operation by receiving the second data voltage.

In an embodiment, the analog-to-digital converter 130 may generate one digital signal based on a difference between the second reset voltage and the second data voltage. That is, the analog-to-digital converter 130 may generate a digital signal for one pixel included in the second luminance image based on the difference between the second reset voltage and the second data voltage.

In an embodiment, the second luminance image may be a high luminance image. In this case, the operation of the first image pixel PX1_3 during the fourteenth to seventeenth time periods T14 to T17 may be referred to as a high luminance sensing operation. However, the scope of the present disclosure is not limited thereto.

For a more concise description, in FIG. 15, an embodiment in which the first pump signal PPX1 is logic high during the twelfth interval T12 and the second pump signal PPX2 toggles during the eleventh to twelfth time periods T11 to T12 is representatively described, but the scope of the present disclosure is not limited thereto. For example, the first pump signal PPX1 may be logic high during the thirteenth to seventeenth time periods T13 to T17, and may be logic high prior to the tenth time period T10. That is, the scope of present disclosure is not limited to a specific point in time when the first pump signal PPX1 and the second pump signal PPX2 transition to logic high.

In an embodiment, even when each of the image pixels of the image sensor device 100 is implemented in a manner similar to the first image pixel PX1_3, the image sensor device 100 may operate in a similar way as described previously described with reference to FIG. 9. However, the scope of the present disclosure is not limited thereto.

In an embodiment, the tenth to seventeenth time periods T10 to T17 may be included in one frame. That is, the tenth to seventeenth time periods T10 to T17 may correspond to one effective integration time for the organic photodiode OPD.

Figure 16:
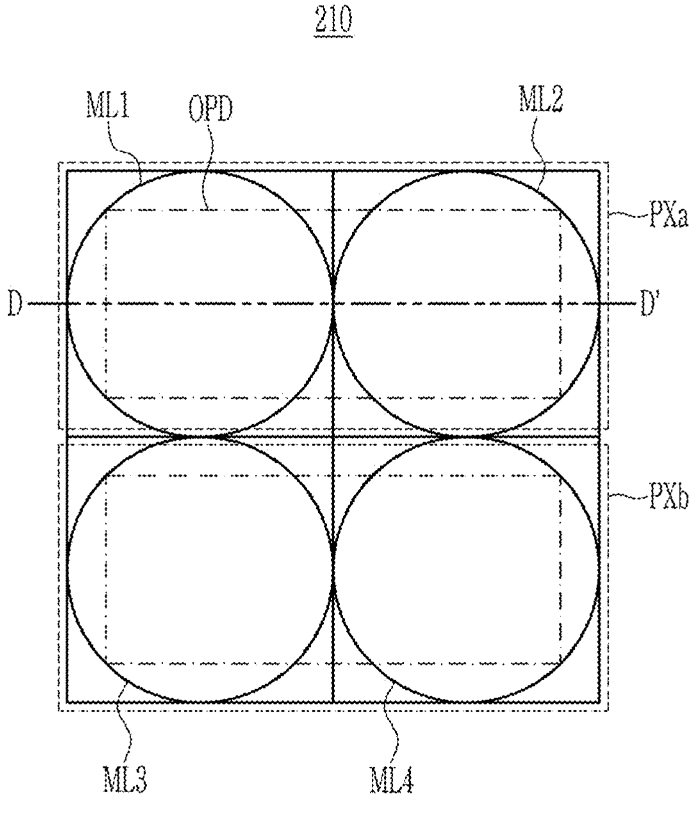
FIG. 16 is a top plan view of a part of an image pixel array of FIG. 1, implemented according to an embodiment of the present disclosure.

FIG. 16 is a top plan view of a part of the image pixel array of FIG. 1, implemented according to an embodiment of the present disclosure.

Referring to FIGS. 1 and 16, an image pixel array 210 may include a first image pixel PXa and a second image pixel PXb. The first image pixel PXa and the second image pixel PXb each may include an organic photodiode OPD.

The first image pixel PXa may include first to second micro-lens ML1 to ML2. The second image pixel PXb may include third to fourth micro-lens ML3 to ML4. That is, according to an embodiment of FIG. 16, one image pixel may include one organic photodiode OPD and a plurality of micro-lenses. Hereinafter, the configuration of the first image pixel PXa will be representatively described. However, the scope of the present disclosure is not limited thereto.

Figure 17:
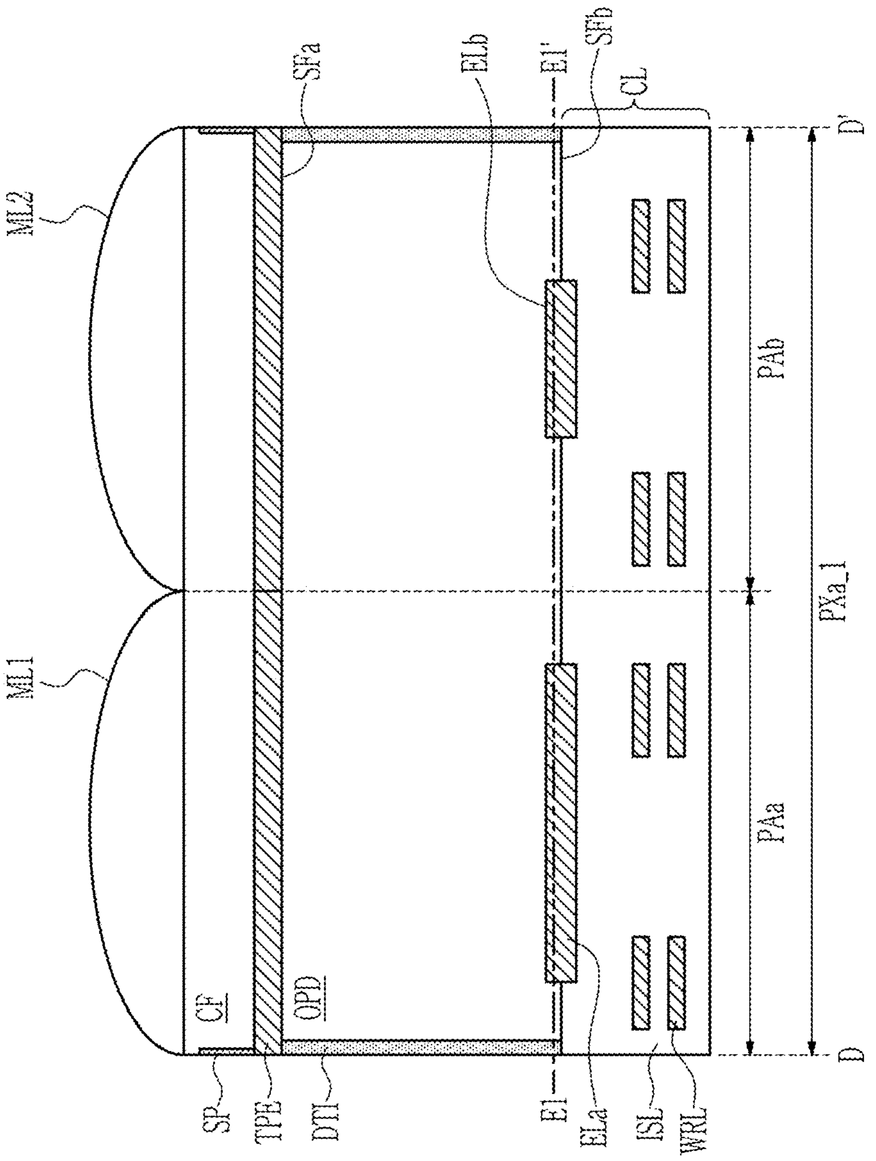
FIG. 17 is a cross-sectional view of FIG. 16, taken along the line D-D', according to an embodiment of the present disclosure.

FIG. 17 is a cross-sectional view of FIG. 16, taken along the line D-D', according to an embodiment of the present disclosure.

Hereinafter, a configuration of a first image pixel PXa_1 implemented according to an embodiment will be representatively described with reference to FIG. 17. However, the scope of the present disclosure is not limited thereto.

Referring to FIGS. 1 and 16 to 17, the first image pixel PXa_1 may include an organic photodiode OPD including a first surface SFa and a second surface SFb. The first image pixel PXa_1 may be implemented through a method similar to that of the first image pixel PX_1 described with reference to FIG. 5. For example, a first electrode ELa and a second electrode ELb may be disposed on the organic photodiode OPD. Hereinafter, a difference between the first image pixel PXa_1 and the first image pixel PX1_1 will be mainly described.

A transparent electrode TPE may be disposed on the first surface SFa of the organic photodiode OPD. A color filter CF, a separation membrane SP, and first and second micro-lenses ML1 and ML2 may be disposed on the transparent electrode TPE. However, the scope of the present disclosure is not limited thereto, and the first image pixel PXa_1 may include three or more micro-lenses. That is, the first image pixel PXa_1 may include a plurality of micro-lenses disposed on one organic photodiode OPD.

In an embodiment, the sizes of micro-lenses included in the image pixel array 110 may all be the same. In this case, since micro-lenses may be produced in a single process, the distribution of size and/or thickness of micro-lenses can be minimized or reduced.

The first image pixel PXa_1 may include a first pixel area PAa and a second pixel area PAb. The first pixel area PAa may refer to a region under the first micro-lens ML1, and the second pixel area PAb may refer to a region under the second micro-lens ML2.

The first electrode ELa may be included in the first pixel area PAa. The second electrode ELb may be included in the second pixel area PAb. That is, the first electrode ELa may be disposed below the first micro-lens ML1, and the second electrode ELb may be disposed below the second micro-lens ML2. However, the scope of the present disclosure is not limited thereto, and the first electrode ELa and the second electrode ELb may be disposed on the second surface SFb regardless of the arrangement of the micro-lenses. For example, the first electrode ELa and second electrode ELb may both be included in the first pixel area PAa. However, in the following description, an embodiment in which the first electrode ELa is included in the first pixel area PAa and the second electrode ELb is included in the second pixel area PAb is representatively described.

Figure 18:
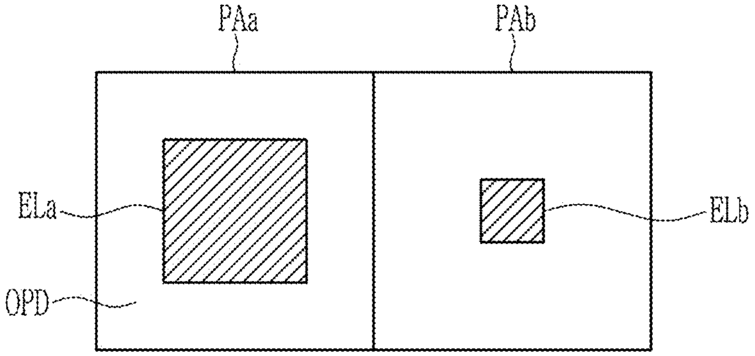
FIG. 18 is a top plan view of FIG. 17, taken along the line E1-E1', according to an embodiment of the present disclosure.

FIG. 18 is a top plan view of FIG. 17, taken along the line E1-E1', according to an embodiment of the present disclosure.

Referring to FIGS. 1 and to 18, the first electrode ELa may be included in the first pixel area PAa. The second electrode ELb may be included in the second pixel area PAb. The area of the first electrode ELa may be larger than the area of the second electrode ELb. In this case, the amount of charges provided to the first electrode ELa in response to a single optical signal may be greater than the amount of charges provided to the second electrode ELb.

Therefore, a readout circuit of the first image pixel PXa_1 may generate a data voltage for a low-illuminance environment based on the charge amount provided from the first electrode ELa, and a data voltage for a high-illuminance environment based on the charge amount provided from the second electrode ELb. The configuration and operation of the readout circuit of the first image pixel PXa_1 are similar to those described above with reference to FIGS. 7 and 8, and therefore a detailed description is omitted.

Figure 19:
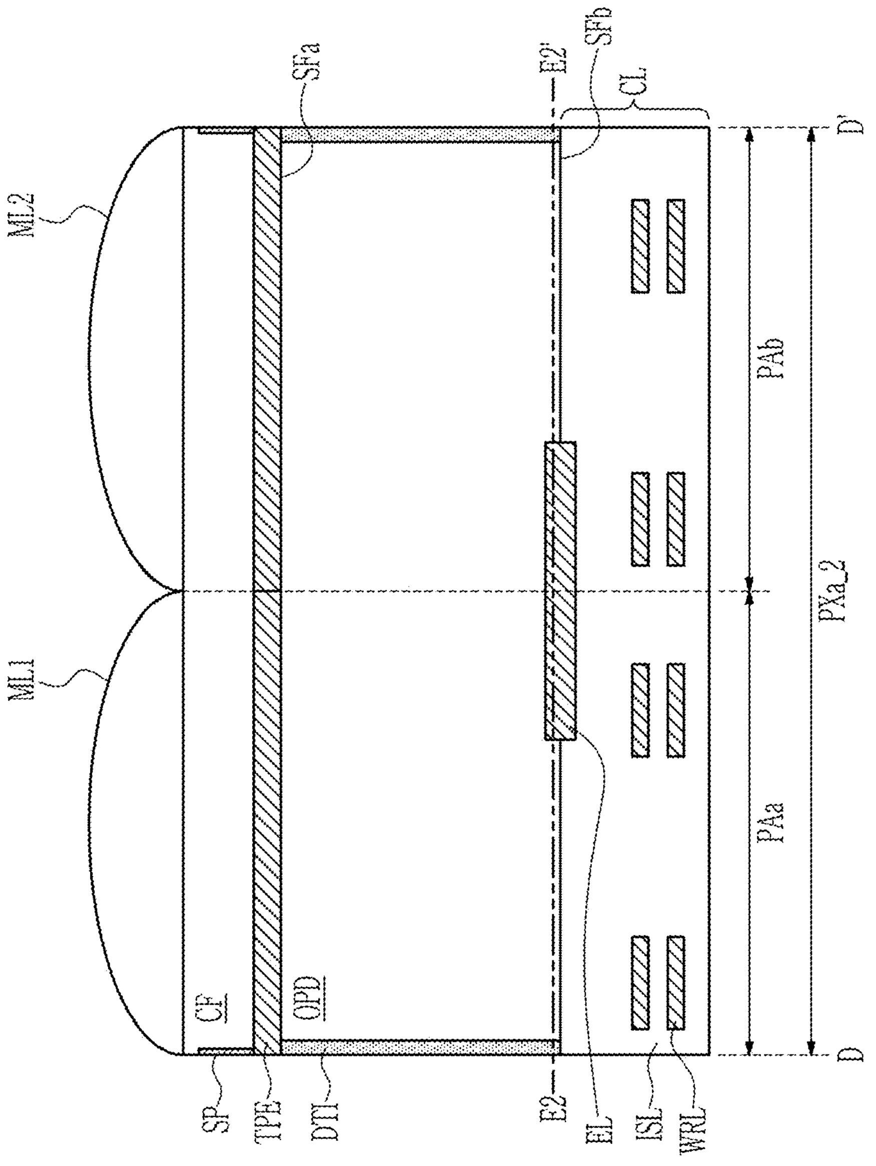
FIG. 19 is a cross-sectional view of the part of the image pixel array of FIG. 16, taken along the line D-D', according to an embodiment of the present disclosure.

FIG. 19 is a cross-sectional view of the part of the image pixel array of FIG. 16, taken along the line D-D', according to an embodiment of the present disclosure.

Hereinafter, referring to FIG. 17, a configuration of a first image pixel PXa_2 implemented according to an embodiment will be representatively described. However, the scope of the present disclosure is not limited thereto.

Referring to FIGS. 1 and 16 to 19, the first image pixel PXa_2 may include an organic photodiode OPD including a first surface SFa and a second surface SFb facing each other. The first image pixel PXa_2 may be implemented in a similar manner to the first image pixel PX1_3 described previously with reference to FIG. 13. For example, one lower electrode EL may be disposed on the second surface SFb of the organic photodiode OPD. Hereinafter, a difference between the first image pixel PXa_2 and the first image pixel PX1_3 will be mainly described.

A transparent electrode TPE may be disposed on the first surface SFa of the organic photodiode OPD. A color filter CF, a separation membrane SP, and first and second micro-lenses ML1 and ML2 may be disposed on the transparent electrode TPE. However, the scope of the present disclosure is not limited thereto, and the first image pixel PXa_2 may include three or more micro-lenses. That is, the first image pixel PXa_2 may include a plurality of micro-lenses disposed on one organic photodiode OPD.

In an embodiment, the sizes of micro-lenses included in the image pixel array 110 may all be the same. In this case, since micro-lenses may be produced in a single process, the distribution of size and/or thickness of micro-lenses can be minimized or reduced.

The lower electrode EL may be placed across the first pixel area PAa and the second pixel area PAb. That is, a part of the lower electrode EL may be placed under the first micro-lens ML1, and another part of the lower electrode EL may be placed under the second micro-lens ML2. However, the scope of the present disclosure is not limited thereto, and the lower electrode EL may be disposed on the second surface SFb without regard to the arrangement of the micro-lenses. For example, the lower electrode EL may be included in a first pixel area PAa. However, hereinafter, an embodiment in which the lower electrode EL is arranged across the first pixel area PAa and the second pixel area PAb will be representatively described.

Figure 20:
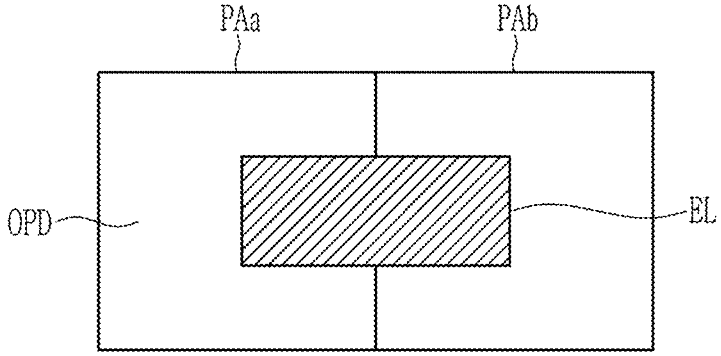
FIG. 20 is a top plan view of FIG. 19, taken along the line E2-E2', according to an embodiment of the present disclosure.

FIG. 20 is a top plan view of FIG. 19, taken along the line E2-E2', according to an embodiment of the present disclosure.

Referring to FIGS. 1, 16, and 19 to 20, the lower electrode EL may be placed throughout the first pixel area PAa and the second pixel area PAb. In this case, charges may be provided to first and second pump transistors PT1 and PT2 from the lower electrode EL in response to optical signals provided to the first micro-lens ML1 and the second micro-lens ML2. The configuration and operation of the readout circuit of the first image pixel PXa_2 are similar to those described with reference to FIGS. 13 to 15, and therefore a detailed description is omitted.

Figure 21:
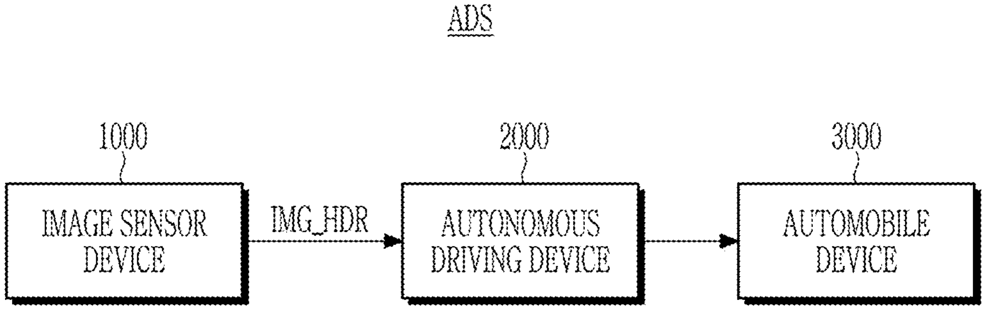
FIG. 21 is a block diagram of an autonomous driving system according to an embodiment of the present disclosure.

FIG. 21 is a block diagram of an autonomous driving system according to an embodiment of the present disclosure.

Referring to FIG. 21, an autonomous driving system ADS may include an image sensor device 1000, an autonomous driving device 2000, and an automobile device 3000.

The image sensor device 1000 may generate an HDR image IMG_HDR based on an optical signal received from the outside. For example, the image sensor device 1000 may be implemented in a similar manner to the image sensor device 100 described previously with reference to FIGS. 1 to 20. That is, each of image pixels of the image sensor device 1000 may include an organic photodiode OPD and may be implemented to generate a data voltage for low illuminance and a data voltage for high illuminance. In this case, the image sensor device 1000 may generate an HDR image IMG_HDR by merging a low luminance image generated through a data voltage for low luminance and a high luminance image generated through a data voltage for high luminance.

In an embodiment, when the image sensor device 1000 is implemented in a similar manner to the image sensor device 100 described with reference to FIGS. 1 to 20, the micro-lenses included in the image pixel array may have a uniform size, and therefore, image errors caused by differences in the size of micro-lenses can be minimized or reduced.

The autonomous driving device 2000 may receive the HDR image IMG_HDR from the image sensor device 1000. The autonomous driving device 2000 may control the automobile device 3000 based on the HDR image IMG_HDR. For example, the autonomous driving device 2000 may include an image signal processor that converts the HDR image IMG_HDR to extract information for controlling the automobile device 3000. In an embodiment, the autonomous driving device 2000 may include an artificial intelligence control module for controlling the automobile device 3000. However, the scope of the present disclosure is not limited to the specific configuration and operation of the autonomous driving device 2000.

In an embodiment, the image sensor device 1000 may be implemented to generate an HDR image IMG_HDR by utilizing an organic photodiode instead of generating the HDR image IMG_HDR by adjusting an effective integration time (EIT). In this case, the HDR image IMG_HDR may appropriately include information utilized for driving the automobile device 3000. For example, the HDR image IMG_HDR may include information provided from a flickering light source such as a signal light and the like. Thus, according to an embodiment of the present disclosure, the autonomous driving device 2000 can safely control the automobile device 3000 based on the HDR image IMG_HDR.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. An image pixel, comprising:
an organic photodiode;
a first electrode connected to a first voltage;
a second electrode connected to a second voltage,
wherein the first electrode and the second electrode are disposed on a first surface of the organic photodiode; and
a read-out circuit be connected to the first electrode and the second electrode,
wherein the read-out circuit provides a first data voltage based on a first charge amount provided from the first electrode to a first data line, and provides a second data voltage based on a second charge amount provided from the second electrode to the first data line.

2. The image pixel of claim 1, further comprising:
a transparent electrode disposed on a second surface of the organic photodiode and connected to a ground voltage that is lower than the first voltage and the second voltage.

3. The image pixel of claim 2, wherein:
the first electrode and the second electrode are opaque electrodes.

4. The image pixel of claim 2, wherein:
the first charge amount is determined based on an area of the first electrode and the first voltage, and
the second charge amount is determined based on an area of the second electrode and the second voltage.

5. The image pixel of claim 1, further comprising:
a third electrode disposed on the first surface of the organic photodiode; and
an electrode merge switch configured to connect the first electrode and the third electrode in a first mode and to connect the second electrode and the third electrode in a second mode, in response to an electrode merge signal.

6. The image pixel of claim 1, wherein the read-out circuit comprises:
a reset transistor connected between a power voltage and a first floating diffusion node and configured to operate in response to a reset signal;
a first transfer transistor connected between the first electrode and the first floating diffusion node and configured to operate in response to a first transfer signal;
a second transfer transistor connected between the second electrode and a second floating diffusion node and configured to operate in response to a second transfer signal;
a switch transistor connected between the first floating diffusion node and the second floating diffusion node and configured to operate in response to a switch signal;
a drive transistor connected between the power voltage and a middle node, and configured to operate in response to a voltage level of the first floating diffusion node; and
a select transistor connected between the middle node and the first data line and that receives a select signal.

7. The image pixel of claim 6, wherein:
the first transfer transistor is turned on during a first time period,
the second transfer transistor is turned on during a second time period, which is after the first time period, and
the switch transistor is turned off during the first time period and turned on during the second time period.

8. The image pixel of claim 7, wherein the select transistor is configured to:

provide the first data voltage to the first data line in a third time period, which is between the first time period and the second time period, and provide the second data voltage to the first data line in a fourth time period, which is after the second time period.

9. An image pixel, comprising:

an organic photodiode;

a first electrode disposed on a first surface of the organic photodiode;

a first pump transistor connected between the first electrode and a first storage node, and configured to operate in response to a first pump signal;

a second pump transistor connected between the first electrode and a second storage node, and configured to operate in response to a second pump signal; and a read-out circuit configured to provide a first data voltage based on a first charge amount stored in the first storage node to a first data line, and to provide a second data voltage based on a second charge amount stored in the second storage node to the first data line.

10. The image pixel of claim 9, wherein:

the read-out circuit comprises:

a first transfer transistor connected between the first storage node and a first floating diffusion node and configured to operate in response to a first transfer signal;

a second transfer transistor connected between the second storage node and a second floating diffusion node and configured to operate in response to a second transfer signal;

a switch transistor connected between the first floating diffusion node and the second floating diffusion node and configured to operate in response to a switch signal;

a reset transistor connected between a power voltage and the first floating diffusion node and configured to operate in response to a reset signal;

a drive transistor connected between the power voltage and a middle node, and configured to operate in response to a voltage level of the first floating diffusion node; and a select transistor connected between the middle node and the first data line, and configured to operate in response to a select signal.

11. The image pixel of claim 10, wherein:

the first transfer transistor is turned on during a first time period, the second transfer transistor is turned on during a second time period, which is after the first time period, and the switch transistor is turned off during the first time period and turned on during the second time period.

12. The image pixel of claim 11, wherein the select transistor is configured to:

provide the first data voltage to the first data line in a third time period, which is between the first time period and the second time period, and provide the second data voltage to the first data line in a fourth time period, which is after the second time period.

13. The image pixel of claim 12, wherein:

the first pump transistor is turned on during the first time period, and the second pump transistor operates in response to the second pump signal, which repeatedly transitions between a logic high level and a logic low level during the first time period and a fifth time period preceding the first time period.

14. The image pixel of claim 13, wherein:

a first sum of lengths of time periods when the second pump signal is at the logic high level is shorter than a second sum of lengths of time periods when the second pump signal is at the logic low level during the first time period and the fifth time period.

15. The image pixel of claim 14, wherein:

the first sum of the lengths of the time periods in which the second pump signal is at the logic high level during the first time period and the fifth time period is shorter than the first time period.

16. The image pixel of claim 13, wherein:

the first pump transistor operates in response to the first pump signal, and a voltage level of the first pump signal is lower than a ground voltage during the fifth time period.

17. An image sensor device, comprising:

a first image pixel including a first organic photodiode connected to a first electrode and a second electrode, and configured to generate a first data voltage based on a charge amount integrated in the first electrode, and to generate a second data voltage based on a charge amount integrated in the second electrode;

a second image pixel including a second organic photodiode connected to a third electrode and a fourth electrode, and configured to generate a third data voltage based on a charge amount integrated in the third electrode, and to generate a fourth data voltage based on a charge amount integrated in the fourth electrode;

an analog-to-digital converter configured to generate a first data signal to a fourth data signal based on the first data voltage to the fourth data voltage, respectively; and an image merge circuit configured to generate a third image based on a first image and a second image, wherein the first image is based on the first and third data signals, and the second image is based on the second and fourth data signals.

18. The image sensor device of claim 17, wherein:

the first image pixel comprises one or more first micro-lenses disposed on the first organic photodiode, the second image pixel comprises one or more second micro-lenses disposed on the second organic photodiode, and the one or more first micro-lenses and the one or more second micro-lenses are same size.

19. The image sensor device of claim 17, wherein:

the first image pixel further comprises:

a reset transistor connected between a power voltage and a first floating diffusion node and configured to operate in response to a reset signal;

a first transfer transistor connected between the first electrode and a first floating diffusion node and configured to operate in response to a first transfer signal;

a second transfer transistor connected between the second electrode and a second floating diffusion node and configured to operate in response to a second transfer signal;

a switch transistor connected between the first floating diffusion node and the second floating diffusion node and configured to operate in response to a switch signal;

a drive transistor connected between the power voltage and a middle node, and configured to operate in response to a voltage level of the first floating diffusion node; and a select transistor connected between the middle node and a first data line and configured to operate in response to a select signal.

20. The image sensor device of claim 17, wherein:

the first electrode and the third electrode have a first size, and the second electrode and the fourth electrode have a second size that is smaller than the first size.

* * * * *